US009472523B2

(12) United States Patent
Miao et al.

(10) Patent No.: US 9,472,523 B2
(45) Date of Patent: Oct. 18, 2016

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chia-Chun Miao, Taichung (TW); Shih-Wei Liang, Taichung County (TW); Yen-Ping Wang, Changhua County (TW); Kai-Chiang Wu, Hsinchu (TW); Ming-Kai Liu, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 292 days.

(21) Appl. No.: 14/155,152

(22) Filed: Jan. 14, 2014

(65) Prior Publication Data

US 2015/0200173 A1 Jul. 16, 2015

(51) Int. Cl.
*H01L 23/48* (2006.01)
*H01L 23/00* (2006.01)

(52) U.S. Cl.
CPC ............ *H01L 24/13* (2013.01); *H01L 24/02* (2013.01); *H01L 24/11* (2013.01); *H01L 24/14* (2013.01); *H01L 24/81* (2013.01); *H01L 24/05* (2013.01); *H01L 24/16* (2013.01); *H01L 24/32* (2013.01); *H01L 2224/0231* (2013.01); *H01L 2224/0239* (2013.01); *H01L 2224/02331* (2013.01); *H01L 2224/02375* (2013.01); *H01L 2224/0345* (2013.01); *H01L 2224/03462* (2013.01); *H01L 2224/0401* (2013.01); *H01L 2224/05552* (2013.01); *H01L 2224/05553* (2013.01); *H01L 2224/05555* (2013.01); *H01L 2224/05569* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01);
(Continued)

(58) Field of Classification Search
CPC ........................................................ H01L 23/48
See application file for complete search history.

(56) References Cited

U.S. PATENT DOCUMENTS

| 2008/0265367 | A1 | 10/2008 | Tan et al. |
| 2013/0180772 | A1 | 7/2013 | Inoue et al. |
| 2014/0110835 | A1* | 4/2014 | Ong ............ H01L 25/072 257/737 |

OTHER PUBLICATIONS

Chia-Chun Miao. U.S. Appl. No. 14/098,218 (not yet published). Application Date Dec. 5, 2013.
Official action issued by Taiwan Intellectual Property Office on May 20, 2016.

* cited by examiner

*Primary Examiner* — Marvin Payen
(74) *Attorney, Agent, or Firm* — Chun-Ming Shih

(57) ABSTRACT

A semiconductor structure includes a conductive bump for disposing over a substrate and an elongated ferromagnetic member surrounded by the conductive bump, including a first end and a second end, and extending from the first end to the second end, the elongated ferromagnetic member is disposed substantially orthogonal to the substrate to dispose the conductive bump at a predetermined orientation and at a predetermined position of the substrate. Further, a method of manufacturing a semiconductor structure includes providing a substrate, forming a conductive trace within the substrate, applying an electric current passing through the conductive trace to generate an electromagnetic field and disposing a conductive bump including an elongated ferromagnetic member in a predetermined orientation and at a predetermined position above the substrate in response to the electromagnetic field generated by the conductive trace.

19 Claims, 24 Drawing Sheets

(52) U.S. Cl.
CPC ............... *H01L 2224/05664* (2013.01); *H01L 2224/05684* (2013.01); *H01L 2224/11005* (2013.01); *H01L 2224/11334* (2013.01); *H01L 2224/131* (2013.01); *H01L 2224/133* (2013.01); *H01L 2224/13005* (2013.01); *H01L 2224/13014* (2013.01); *H01L 2224/13024* (2013.01); *H01L 2224/13294* (2013.01); *H01L 2224/1401* (2013.01); *H01L 2224/73204* (2013.01); *H01L 2224/81121* (2013.01); *H01L 2224/81815* (2013.01); *H01L 2924/181* (2013.01)

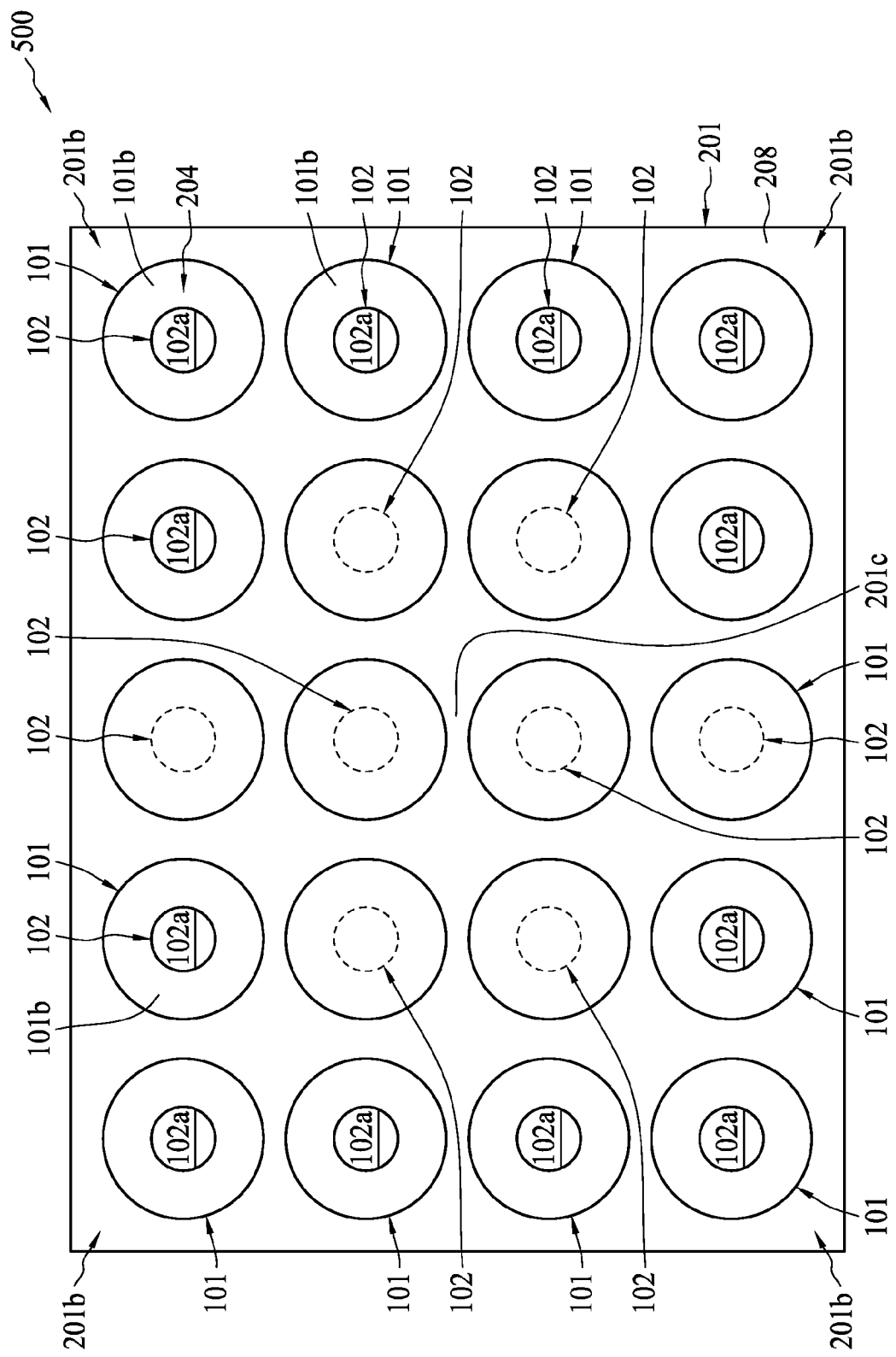

SEMICONDUCTOR STRUCTURE AND MANUFACTURING METHOD THEREOF

BACKGROUND

The disclosure relates to a semiconductor structure and a method of manufacturing a semiconductor structure.

Modern integrated circuits (IC) are comprised of millions of active devices, such as transistors and capacitors. These devices are initially isolated from each other but are later interconnected together to form functional circuits. Typical interconnect structures include lateral interconnections, such as metal lines (wirings), and vertical interconnections, such as though holes, vias, and contacts. Interconnections are increasingly determining the limits of performance and the density of modern integrated circuits. Electrical connections are made through bond pads on a die to a package substrate. The bond pads can be used for wire bonding or flip-chip bonding. Flip-chip packaging utilizes bumps to establish electrical connections between input/output (I/O) pads of a die and a substrate. Further, a bump is disposed on a surface of the substrate to become a semiconductor package. The bump is then heat treated to maintain its position on the substrate.

In addition to flip-chip packaging, wafer level chip scale packaging (WLCSP) is widely used for its low cost and relatively simple manufacturing operations. During the WLCSP operation, a number of semiconductor components are assembled on a semiconductor wafer. However, due to the miniaturized scale of most semiconductor packages, the semiconductor components are becoming increasingly smaller and denser on the semiconductor wafer. Furthermore, numerous manufacturing operations are implemented within such a small semiconductor wafer. Thus, manufacturing of the electrical interconnections between semiconductor components becomes more complicated and may result in the complexity of the manufacturing to cause an increase in yield loss, such as poor reliability of the semiconductor package. Such circumstances have created more challenges for modifying the structure of semiconductor packages and improving the manufacturing operations. As such, there is a continuous need to improve the method for manufacturing semiconductor packages and solving the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a schematic view of a semiconductor structure with several conductive bumps including an exposed end of an elongated ferromagnetic member adjacent to a corner of a substrate in accordance with some embodiments.

DETAILED DESCRIPTION OF THE DISCLOSURE

Figure 1:
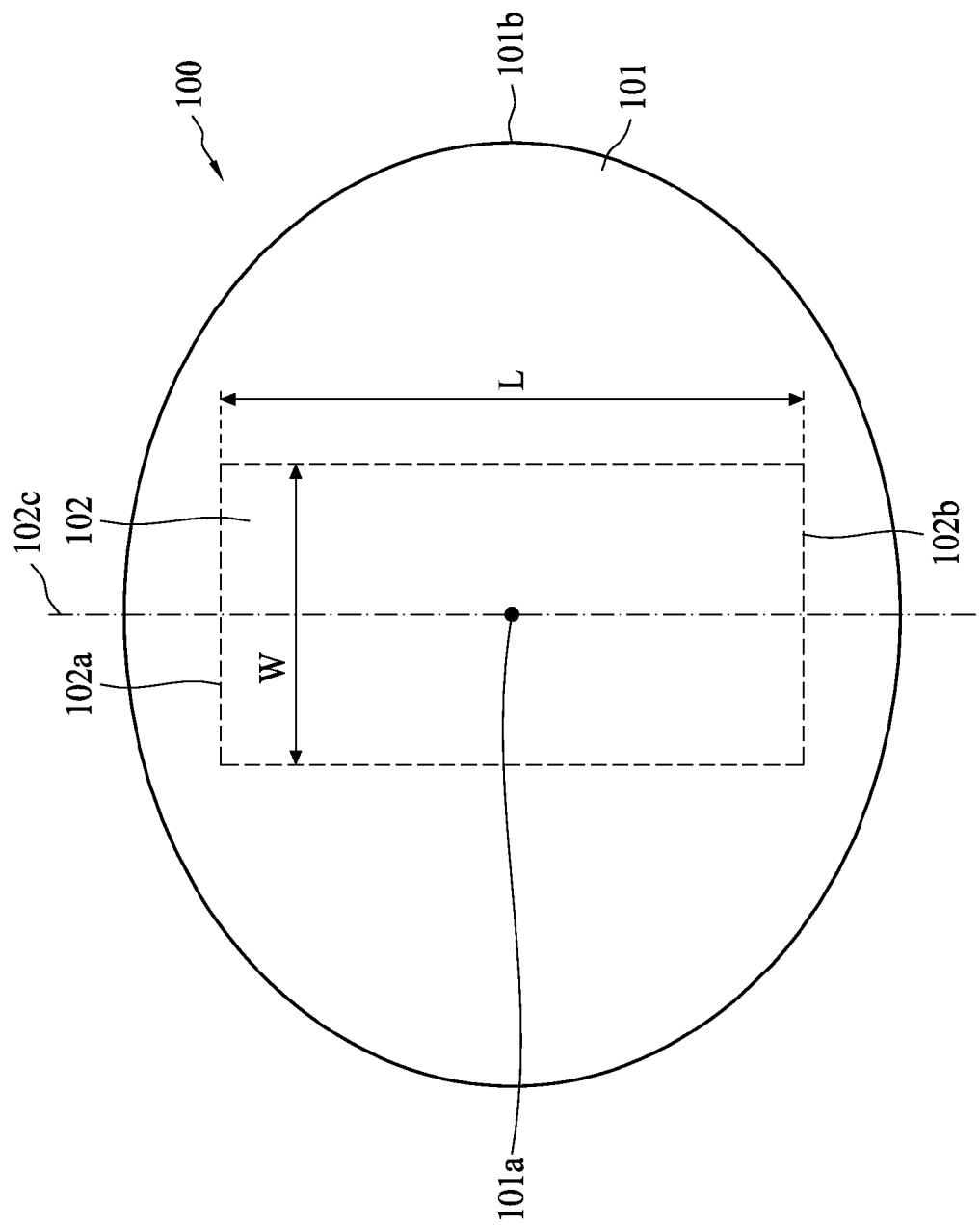
FIG. 1 is a schematic view of a semiconductor structure with an elongated ferromagnetic member in a cylindrical shape in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. During the manufacturing, a number of conductive bumps are disposed on respective bump pads of a substrate or a wafer. The wafer has to be aligned or calibrated to a correct position and orientation prior to a bump mounting operation. After the alignment operation, the conductive bumps are dropped and then mounted on the bump pads by a reflow operation. Each of the conductive bumps has to be placed at an appropriate position of the bump pad on the wafer. After the reflow operation, the conductive bumps are configured for electrically connecting with another substrate or device.

However, an opaque molding compound is disposed over the wafer prior to the alignment operation and the bump mounting operation. In other words, an alignment mark on the wafer is covered by the molding compound and thus cannot be clearly seen from a top of the wafer. As such, the wafer is in fact undergone so called a "blind" alignment prior to the bump mounting operation. Since the alignment is based on the unseen alignment mark on the wafer, misalignment of the wafer is suffered. Furthermore, the misalignment of the wafer would affect subsequent operations. For example, the conductive bumps cannot be placed at a correct predetermined position of the bump pad on the wafer, and ultimately the wafer would be poorly bonded with another substrate or device by the conductive bumps. As a result, the wafer would have a poor reliability on an electrical connection and high yield loss.

In the present disclosure, a semiconductor structure with a structural improvement is disclosed. The semiconductor structure includes an elongated ferromagnetic member within a conductive bump to facilitate an alignment and accurate placement of the conductive bump on a predetermined position of a substrate or wafer. When an electric current passes through a conductive trace and generates an electromagnetic field at the conductive trace, the elongated ferromagnetic member as well as the conductive bump are electromagnetically attracted and thus oriented at a predetermined orientation and disposed at the predetermined position.

FIG. 1 is a diagram of a semiconductor structure 100 in accordance with various embodiments of the present disclosure. The semiconductor structure 100 includes a conductive bump 101. In some embodiments, the conductive bump 101 is configured for bonding a wafer or a substrate with another wafer or substrate. An electrical connection is established between two wafers or substrates after a reflow operation. In some embodiments, the conductive bump 101 is a solder ball, a solder bump, a solder paste or etc. In some embodiments, the conductive bump 101 includes a solder material such as tin, lead, copper, gold, nickel or combinations thereof. In some embodiments, the conductive bump is in a spherical, hemispherical or cylindrical shape. In some embodiments, the conductive bump has a cross sectional surface in circular, quadrilateral or polygonal shape.

In some embodiments, the semiconductor structure 100 includes an elongated ferromagnetic member 102 surrounded by the conductive bump 101. In some embodiments, the ferromagnetic member 102 is encapsulated by the conductive bump 101. In some embodiments, the elongated ferromagnetic member 102 includes a first end 102a and a second end 102b at its two ends. The elongated ferromagnetic member 102 extends from the first end 102a to the second end 102b within the conductive bump 101. In some embodiments, the first end 102a is covered by an outer surface 101b of the conductive bump 101. In some embodiments, the elongated ferromagnetic member 102 is in a cylindrical shape. In some embodiments, elongated ferromagnetic member 102 has a cross section in a circular, quadrilateral, polygonal or cross shape. In some embodiments, the elongated ferromagnetic member 102 includes ferromagnetic material such as iron.

Figure 1A:
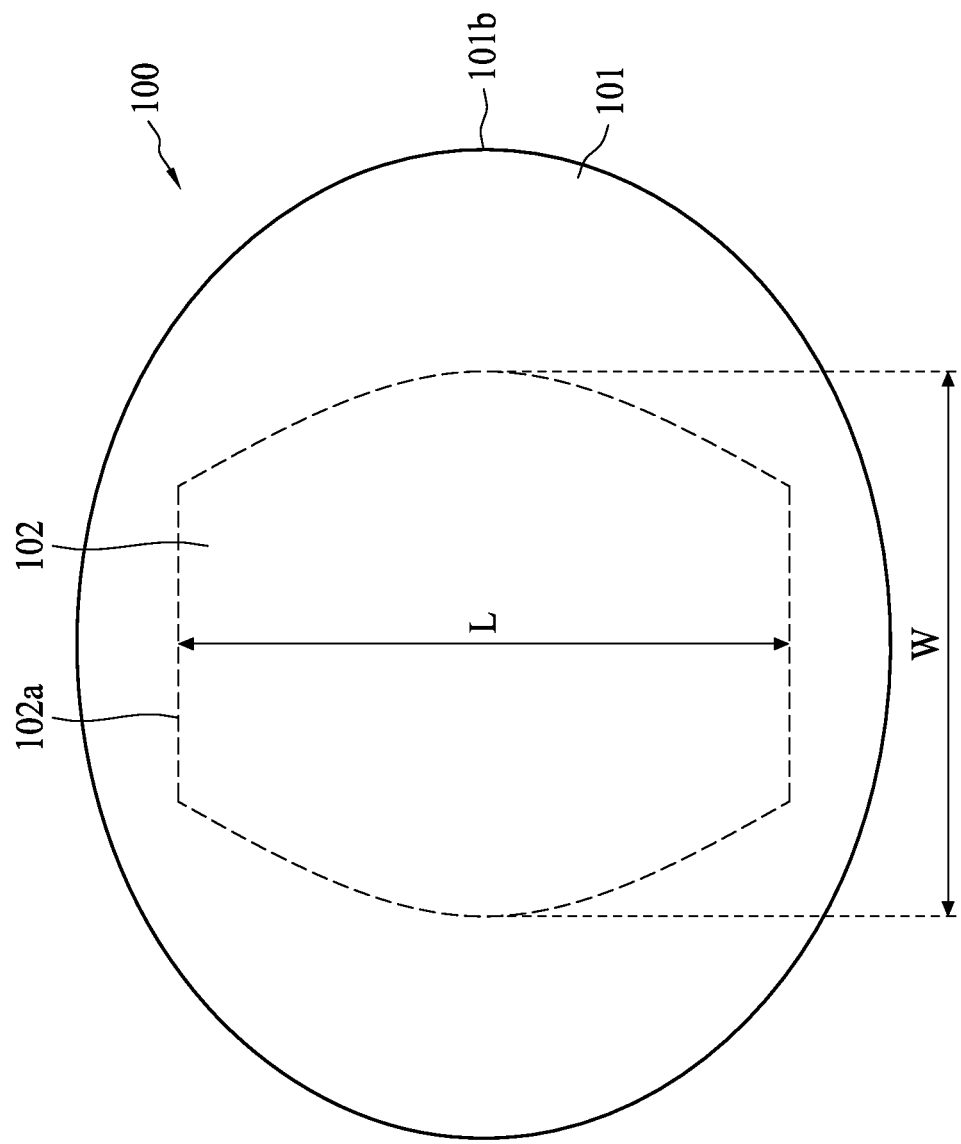
FIG. 1A is a schematic view of a semiconductor structure with an elongated ferromagnetic member in a belly shape in accordance with some embodiments.

In some embodiments, the elongated ferromagnetic member 102 has a width W which is a longest horizontal length across the elongated ferromagnetic member 102. In some embodiments, the width W is measured at the first end 102a or the second end 102b. In some embodiments, the width W is measured approximately at a center of the elongated ferromagnetic member 102 as shown in FIG. 1A.

Referring back to FIG. 1, the elongated ferromagnetic member 102 has a length L which is the longest vertical length from the first end 102a to the second end 102b. In some embodiments, the length L is a height of the elongated ferromagnetic member 102. In some embodiments, the length L is a distance between the first end 102a and the second end 102b as shown in FIG. 1A.

In some embodiments, the elongated ferromagnetic member 102 has a ratio of a width W to a length L. In some embodiments, the ratio is about 1:2 to about 1:20. In some embodiments, the ratio is about 1:1.5 to about 1:30. In some embodiments, the width W is substantially smaller than the length L.

In some embodiments, the elongated ferromagnetic member 102 has a central axis 102c passing through the first end 102a and the second end 102b along the length L. In some embodiments, the central axis 102c passes through a center 101a of the conductive bump 101. The center 101a of the conductive bump 101 is on the central axis 102c of the elongated ferromagnetic member 102.

Figure 2:
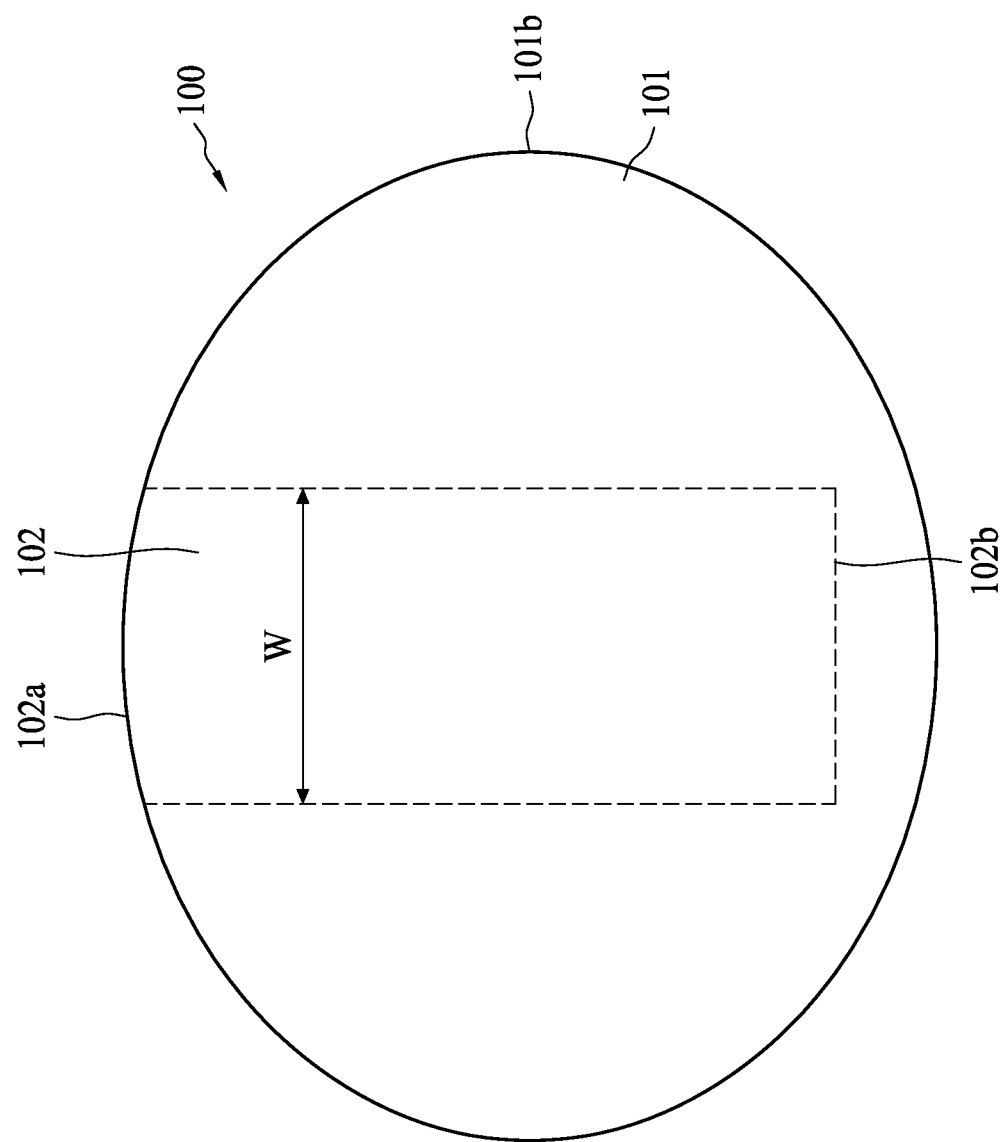
FIG. 2 is a schematic view of a semiconductor structure with an exposed end of an elongated ferromagnetic member in accordance with some embodiments.

In some embodiments, the first end 102a of the elongated ferromagnetic member 102 is exposed from the outer surface 101b of the conductive bump 101 as shown in FIG. 2. In some embodiments, a profile of the first end 102a is conformal to the outer surface 101b of the conductive bump 101. In some embodiments, the exposed first end 102a is configured for subsequent alignment operation.

Figure 2A:
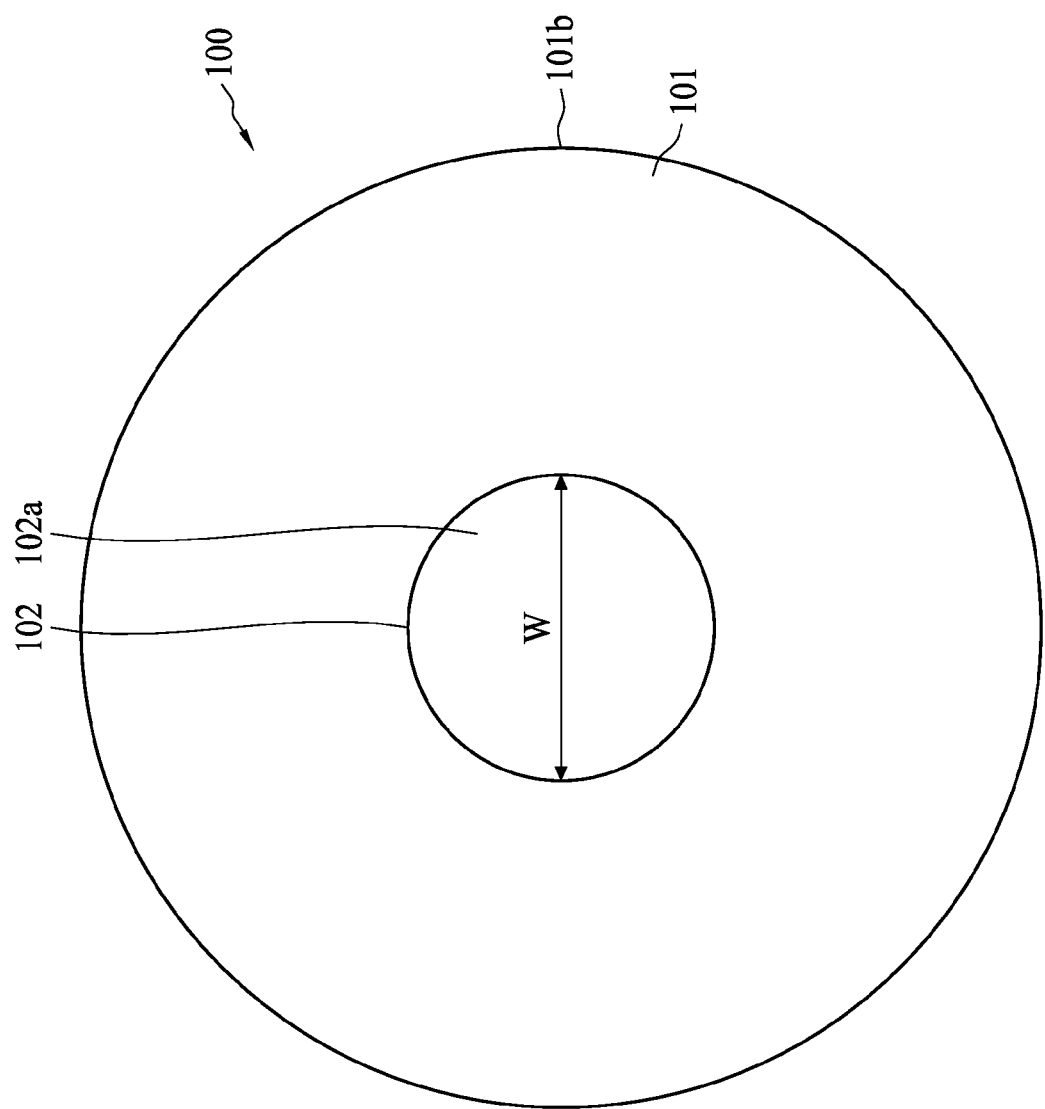
FIG. 2A is a schematic view of a semiconductor structure with a circular exposed end of an elongated ferromagnetic member in accordance with some embodiments.
Figure 2C:
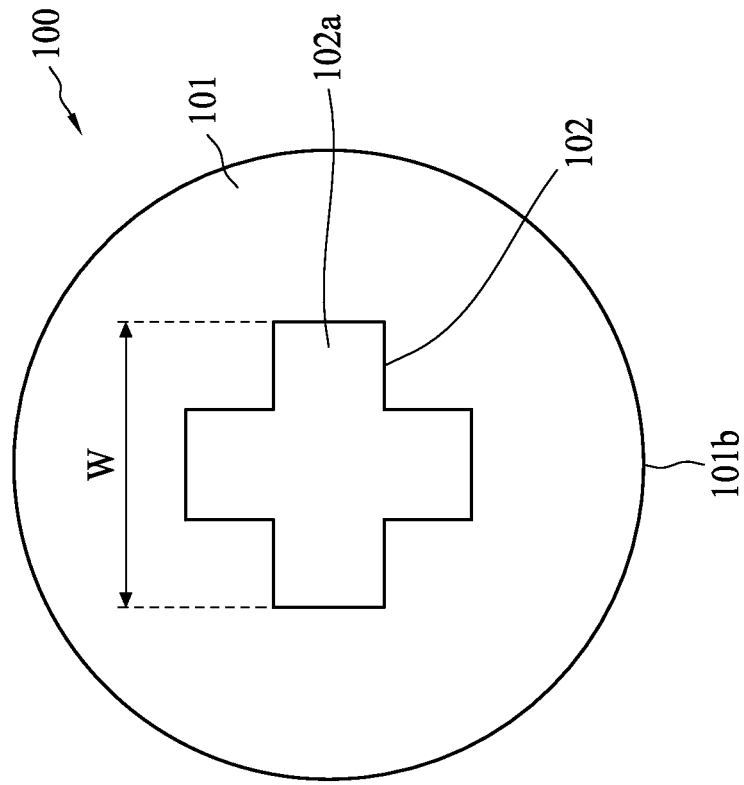
FIG. 2C is a schematic view of a semiconductor structure with an exposed end of an elongated ferromagnetic member in a cross shape in accordance with some embodiments.
Figure 2B:
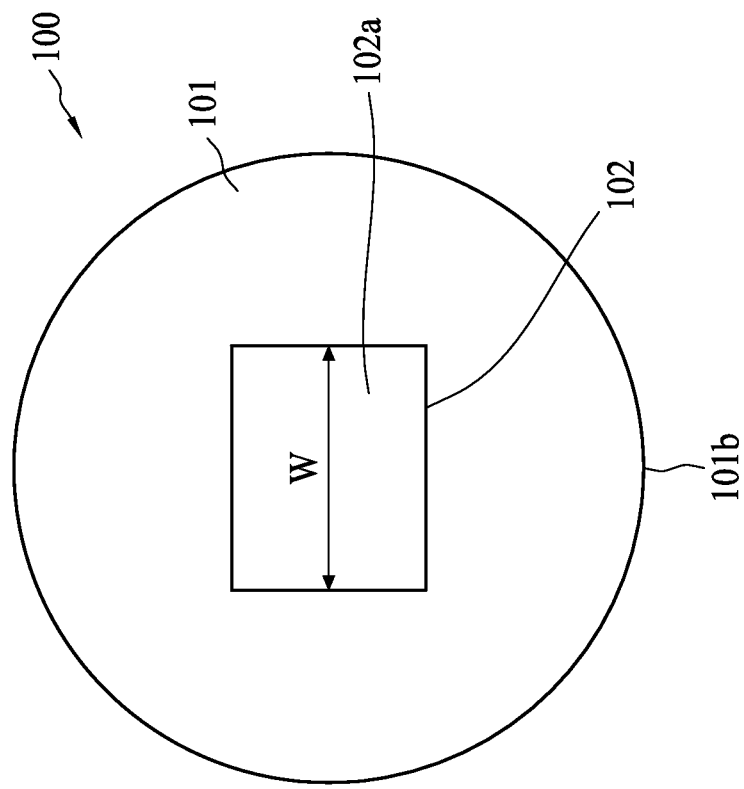
FIG. 2B is a schematic view of a semiconductor structure with a quadrilateral exposed end of an elongated ferromagnetic member in accordance with some embodiments.

In some embodiments, an exposed first end 102a of the elongated ferromagnetic member 101 is in various shape. A top view of the exposed first end 102a is in circular shape as in FIG. 2A, a quadrilateral shape as in FIG. 2B, and a cross shape as in FIG. 2C. In some embodiments as in FIG. 2A, the width W is a diameter of the circular exposed first end 102a of the elongated ferromagnetic member 102. In some embodiments as in FIG. 2B, the width W is a length of a longest side of the exposed first end 102a. In some embodiments as in FIG. 2C, the width W is a longest length between two opposite sides of the exposed first end 102a in the cross shape.

Figure 3:
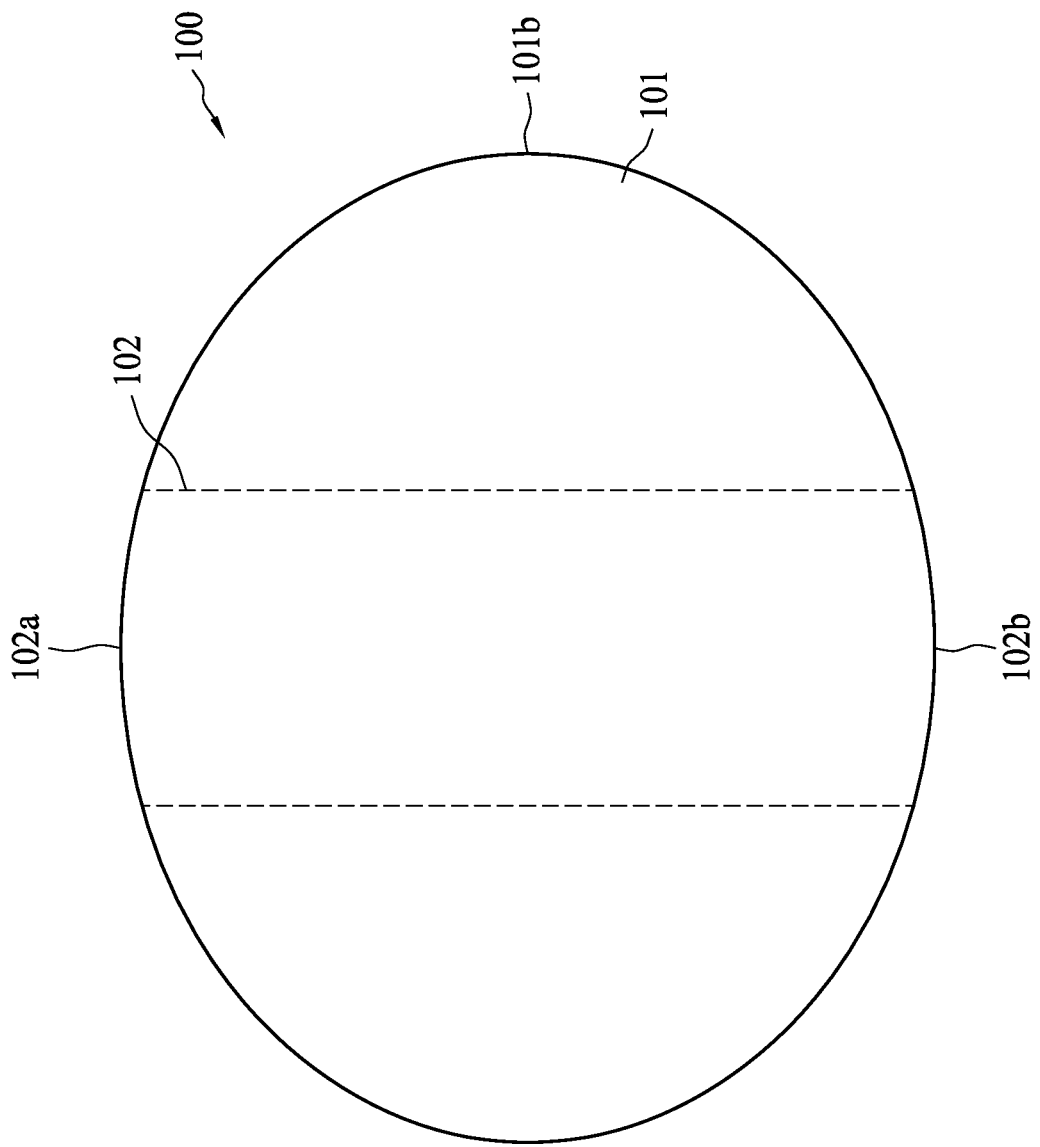
FIG. 3 is a schematic view of a semiconductor structure with two exposed ends of an elongated ferromagnetic member in accordance with some embodiments.

In some embodiments, the second end 102b of the elongated ferromagnetic member 102 is exposed from the outer surface 101b of the conductive bump 101 as shown in FIG. 3. In some embodiments, a profile of the second end 102b is conformal to the outer surface 101b of the conductive bump 101. In some embodiments, the exposed second end 102b is configured for disposing on a bump pad of a substrate or over a surface of a substrate or a wafer. In some embodiments, the profile of the second end 102b is substantially consistent with the profile of the first end 102a.

Figure 4:
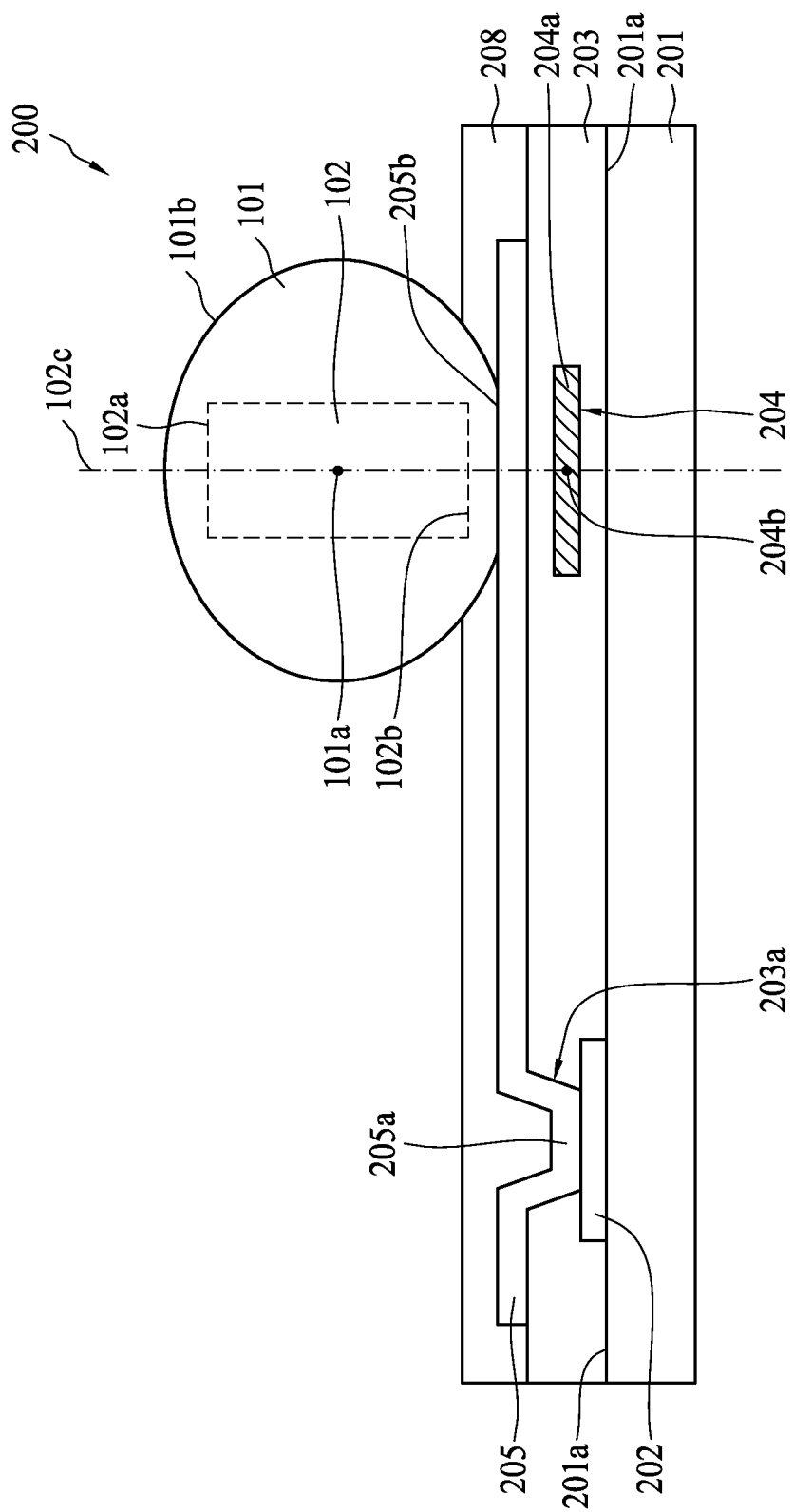
FIG. 4 is a schematic view of a semiconductor structure with a conductive bump in accordance with some embodiments.

FIG. 4 is a diagram of a semiconductor structure 200 in accordance with various embodiments of the present disclosure. In some embodiments, the semiconductor structure 200 includes a conductive bump 101 and an elongated ferromagnetic member 102 which have similar configuration as in FIG. 1. In some embodiments, the semiconductor structure 200 includes a substrate 201. In some embodiments, the substrate 201 is used for carrying and supporting components or circuits. In some embodiments, the substrate 201 is a silicon wafer which would be fabricated to become integrated circuits (IC) in subsequent manufacturing operations. In some embodiments, the substrate 201 is a printed circuit board (PCB).

In some embodiments, a pad 202 is disposed on the substrate 201. The pad 202 is disposed on a top surface 201a of the substrate 201. In some embodiments, a passivation 203 is disposed over the substrate 201 and the pad 202. The passivation 203 surrounds the pad 202. In some embodiments, the passivation 203 includes dielectric materials such as spin-on glass (SOG), silicon oxide, silicon oxynitride, silicon nitride or the like.

In some embodiments, a conductive trace 204 is embedded in the passivation 203. In some embodiments, the conductive trace 204 is a metallic wiring within the passivation and is configured for connecting with a power source. An electric current can pass through the conductive trace 204 from the power source. In some embodiments, the conductive trace 204 includes copper (Cu), gold (Au), platinum (Pt), titanium (Ti), nickel (Ni), aluminum (Al), etc. In some embodiments, the conductive trace 204 is formed by an electroplating operation.

Figure 4A:
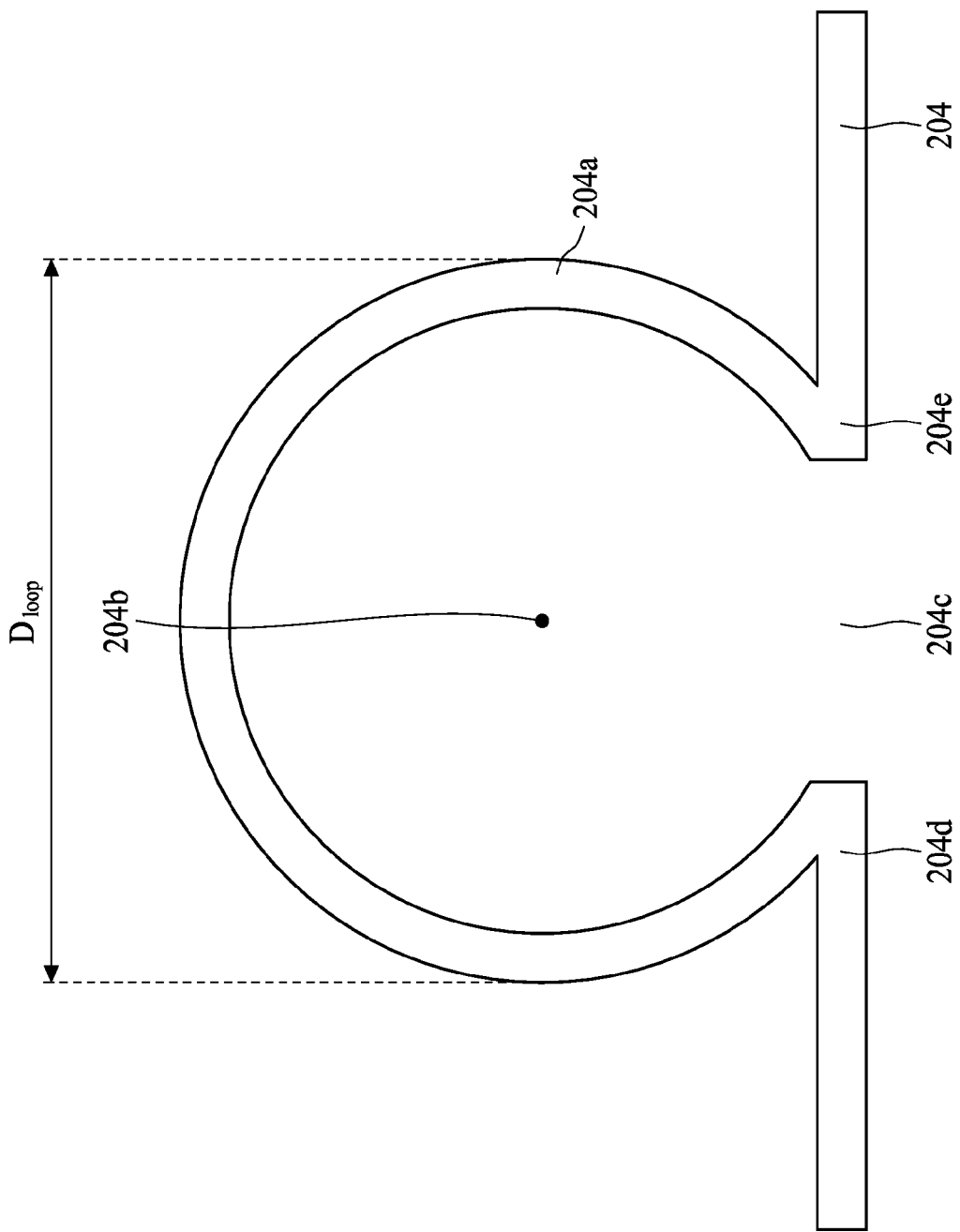
FIG. 4A is a schematic view of a looping portion of a conductive trace in accordance with some embodiments.

FIG. 4A is a top view of the conductive trace 204. In some embodiments, the conductive trace 204 includes a looping portion 204a. In some embodiments, the looping portion 204a is in substantially circular shape and has a center 204b. In some embodiments, the looping portion 204a is in a C-shape. In some embodiments, the looping portion 204 has a diameter $D_{loop}$ of about 100 um to about 300 um.

Figure 4B:
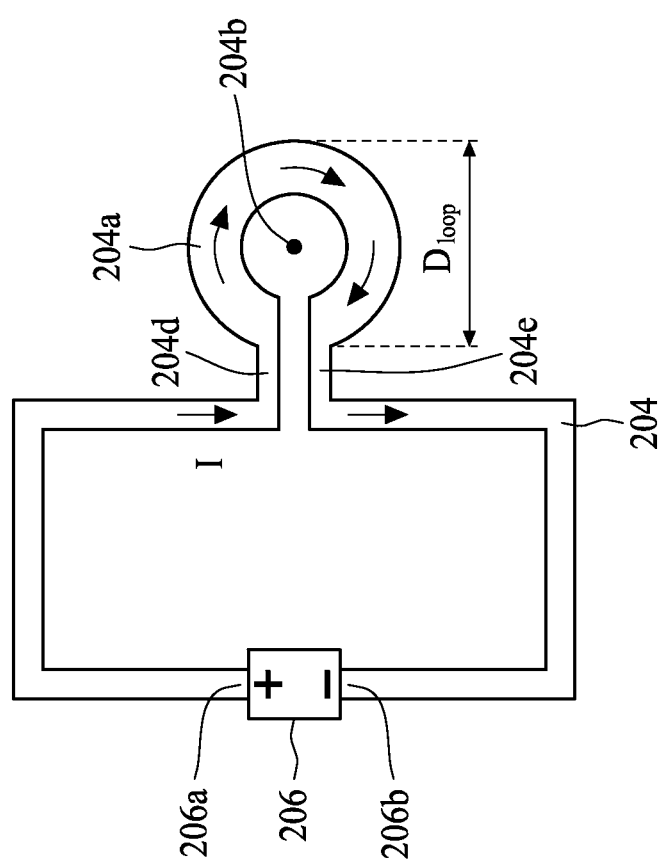
FIG. 4B is a schematic view of a looping portion of a conductive trace connected to a power source in accordance with some embodiments.

In some embodiments as in FIG. 4B, the conductive trace 204 is connected to a power source 206. In some embodiments, an end 204d of the conductive trace 204 is coupled with a positive pole 206a of the power source 206, and another end 204e of the conductive trace 204 is coupled with a negative pole 206b of the power source 206. As such, an electric current I passes through the conductive trace 204 from the end 204d to another end 204e via the looping portion 204a. In some embodiments, the electric current I passes through the looping portion 204a in a clockwise or anti-clockwise direction.

Figure 4C:
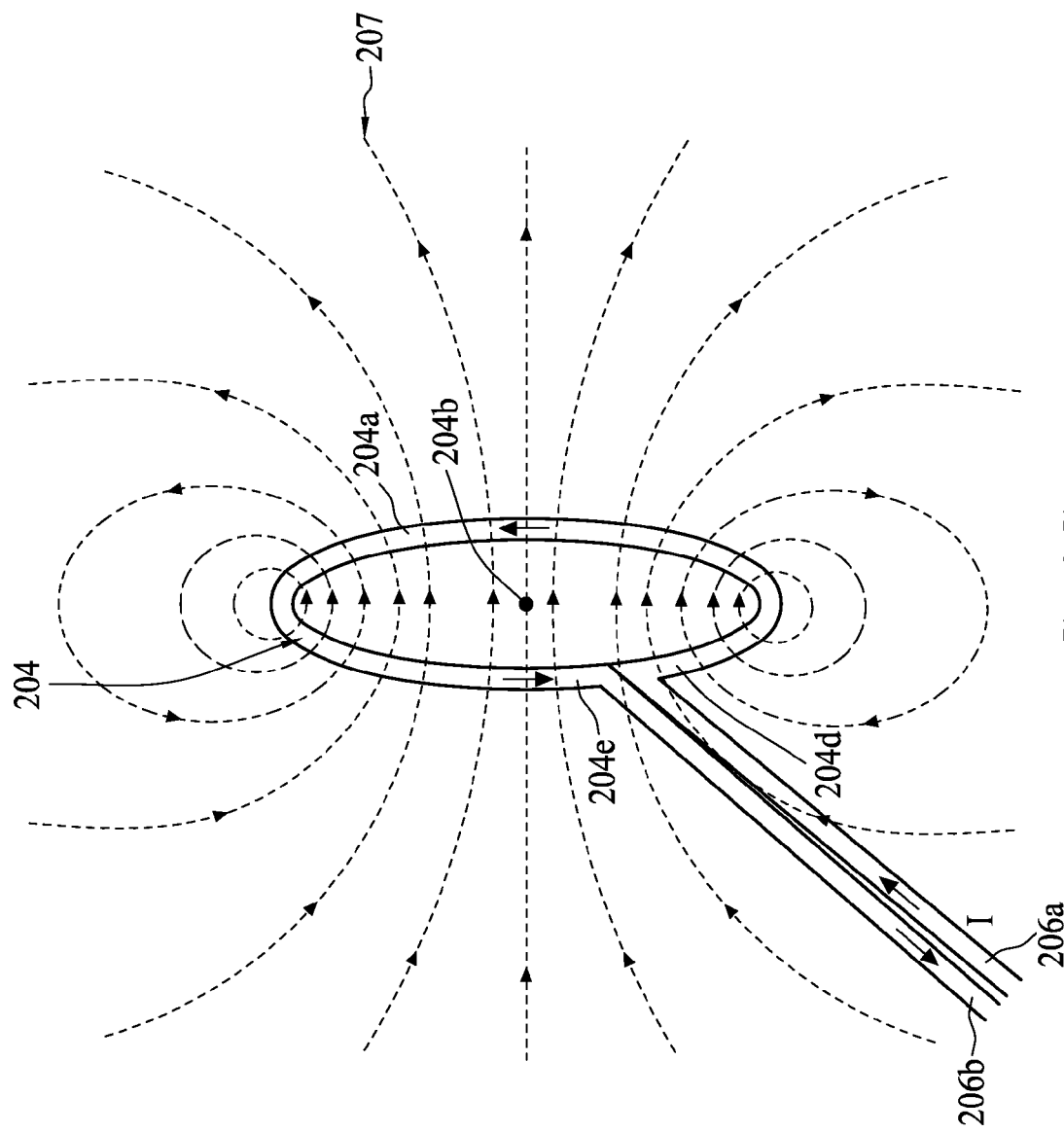
FIG. 4C is a schematic view of an electromagnetic field generated by a looping portion of a conductive trace in accordance with some embodiments.

In some embodiments as in FIG. 4C, an electromagnetic field 207 is generated by the conductive trace 204 when the electric current I passes through the conductive trace 204 from the positive pole 206a to the negative pole 206b via the looping portion 204a. It is to be noted that the electric current I may flow in an opposite direction while the electromagnetic field 207 is still be generated by the conductive trace 204. According to the Biot-Savart Law, the electromagnetic field 207 is more concentrated at the center 204b of the conductive trace 204 than that outside of the conductive trace 204. Therefore, an object containing magnetic or ferromagnetic material will be attracted to a position close to the center 204b of the conductive trace 204 when the object is disposed near the conductive trace 204.

Referring back to FIG. 4, a redistribution layer (RDL) 205 is disposed on the passivation 203 in some embodiments. In some embodiments, the RDL 205 re-routes a path of a circuit of the semiconductor structure 200 from the pad 202 to a conductive bump 101 disposed on the RDL 205 or a bump pad of the semiconductor structure 200. In some embodiments, the RDL 205 is a single material layer or a multi-layered structure. In some embodiments, the RDL 205 includes a seed layer and a metal layer which are disposed in a sequence. In some embodiments, the RDL 205 includes gold, silver, copper nickel, tungsten, aluminum, palladium and/or alloys thereof. In some embodiments, the RDL 205 is made by any suitable method known in the art such as physical vapor deposition (PVD), sputter, CVD, electroplating and/or the like.

In some embodiments, the RDL 205 includes a via portion 205a and a land portion 205b. In some embodiments, the via portion 205a passes through the passivation 203 and is disposed above the pad 202. The via portion 205a is electrically connected with the pad 202. In some embodiments, the via portion 205a is conformal to a via 203a of the passivation 203.

In some embodiments, the via portion 205a electrically connects the pad 202 with the land portion 205b of the RDL 205. In some embodiments, the land portion 205b is configured for receiving a conductive bump. In some embodiments, the land portion 205b extends along a top surface 203b of the passivation 203. In some embodiments, the land portion 205b is disposed above the conductive trace 202. In some embodiments, the land portion 205 is extended substantially parallel to the conductive trace 202.

In some embodiments, a under bump metallization (UBM) pad is disposed on the land portion 205b for receiving a conductive bump. In some embodiments, the UBM pad is a solderable surface for receiving the conductive bump including the solder material. In some embodiments, the UBM pad is a metallurgical layer or a metallurgical stack film over the substrate 201. In some embodiments, the UBM pad includes gold, silver, copper, nickel, tungsten, aluminum, palladium and/or alloys thereof. In some embodiments, the UBM pad is disposed by various manners, such as evaporation, sputtering or electroplating, etc. In some embodiments, the UBM pad is in various shapes such as circular, quadrilateral or polygonal shape.

In some embodiments, the conductive bump 101 including the elongated ferromagnetic member 102 as in FIG. 1 is disposed on the land portion 205b of the RDL 205 and over the substrate 201. In some embodiments, the conductive bump 101 is disposed on a UBM pad above the land portion 205b. In some embodiments, the conductive bump 101 is disposed on the land portion 205b by any suitable operation such as dropping over a stencil.

In some embodiments, the conductive bump 101 is disposed on the land portion 205b and is oriented to a predetermined orientation. In some embodiments, the conductive bump 101 is disposed at the predetermined orientation in which the elongated ferromagnetic member 102 encapsulated in the conductive bump 101 is disposed substantially orthogonal to the substrate 101. In some embodiments, a central axis 102c of the elongated ferromagnetic member 102 is substantially orthogonal to the top surface 201a of the substrate 201. In some embodiments, a central axis 102c of the elongated ferromagnetic member 102 is substantially orthogonal to the land portion 205b of the RDL 205.

In some embodiments, the conductive bump 101 is disposed over a predetermined position of the substrate 201. In some embodiments, the predetermined position is a position above the top surface 201a of the substrate 201. In some embodiments, the predetermined position is on a predetermined portion of the land portion 205b of the RDL 205 above the conductive trace 204. In some embodiments, the conductive bump 101 is disposed at the predetermined position and the elongated ferromagnetic member 102 is substantially orthogonal to the substrate 201. In some embodiments, the central axis 102c of the elongated ferromagnetic member 102 is substantially orthogonal to the conductive trace 204. In some embodiments, the conductive bump 101 is disposed at the predetermined position and the central axis 102c of the elongated ferromagnetic member 102 is disposed within the looping portion 204a of the conductive trace 204. In some embodiments, the conductive bump 101 is disposed at the predetermined position and the central axis 102c of the elongated ferromagnetic member 102 passes through the center 204b of the looping portion 204a of the conductive trace 204. In some embodiments, the conductive bump 101 is at the predetermined position where the center 101a of the conductive bump 101 and the center 204b of the looping portion 204a of the conductive trace 204 are disposed and aligned on the central axis 102c of the elongated ferromagnetic member 102.

In some embodiments, the elongated ferromagnetic member 102 includes the first end 102a and the second end 102b opposite to the first end 102a. In some embodiments, the first end 102a is distal from the conductive trace 204 and the second end 102b is proximal to the conductive trace 204. In some embodiments, the central axis 102c extends from the first end 102a to the second end 102b through the center 101a of the conductive bump 101. In some embodiments, the second end 102b is disposed above the land portion 205b of the RDL 205.

In some embodiments, the elongated ferromagnetic member 102 includes a cross section which is substantially perpendicular to the central axis 102c and is substantially parallel to the conductive trace 204. In some embodiments, the first end 102a or the second end 102b is a flat surface which is substantially perpendicular to the central axis 102c. In some embodiments, the cross section of the elongated ferromagnetic member 102 is in a circular, quadrilateral, polygonal or cross shape.

In some embodiments, the semiconductor structure 200 includes a molding 208 disposed over the substrate 201. In some embodiments, the molding 208 covers the RDL 205 and the passivation 203. In some embodiments, the molding 208 surrounds the conductive bump 101. In some embodiments, the molding 208 is a single layer film or a composite stack. In some embodiments, the molding 208 is a molding compound including various materials such as epoxy resins, phenolic hardeners, silicas, catalysts, pigments, mold release agents, and the like. Material for forming the molding compound has a high thermal conductivity, a low moisture absorption rate, a high flexural strength at board-mounting temperatures, or a combination of these.

Figure 5:
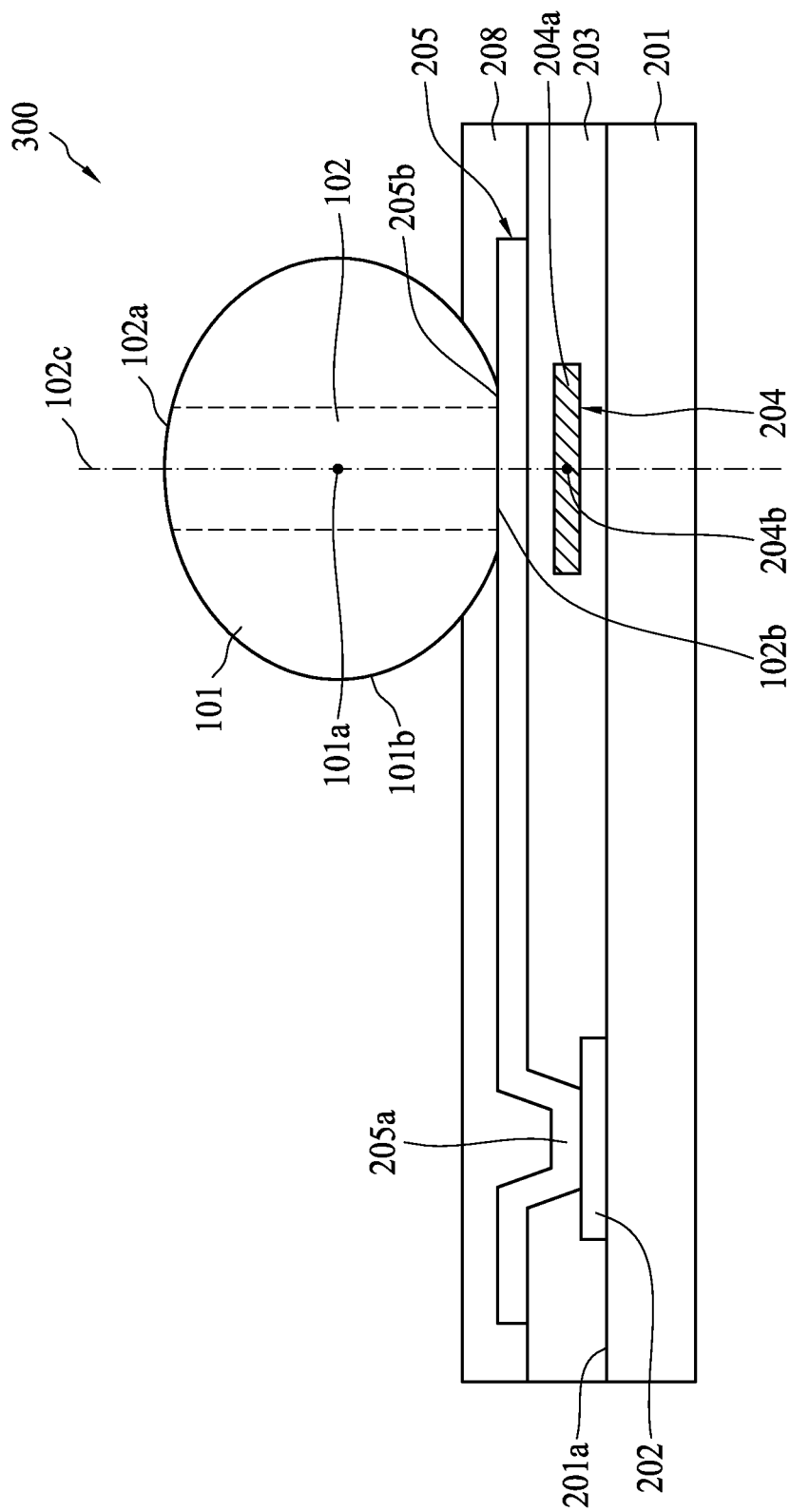
FIG. 5 is a schematic view of a semiconductor structure with a conductive bump in accordance with some embodiments.

FIG. 5 is a diagram of a semiconductor structure 300 in accordance with various embodiments of the present disclosure. In some embodiments, the semiconductor structure 300 includes a substrate 201, a pad 202, a passivation 203, a conductive trace 204, a RDL 205 and a molding 208 that are in similar configuration as in FIG. 4. In some embodiments, the semiconductor structure 300 includes a conductive bump 101 and an elongated ferromagnetic member 102 which have similar configuration as in FIG. 3. In some embodiments, the first end 102a is exposed from an outer surface 101b of the conductive bump 101. In some embodiments, the second end 102b is disposed on a land portion 205b of the RDL 205. In some embodiments, the second end 102b is disposed on a bump pad of the substrate 201 above the land portion 205b.

Figure 6:
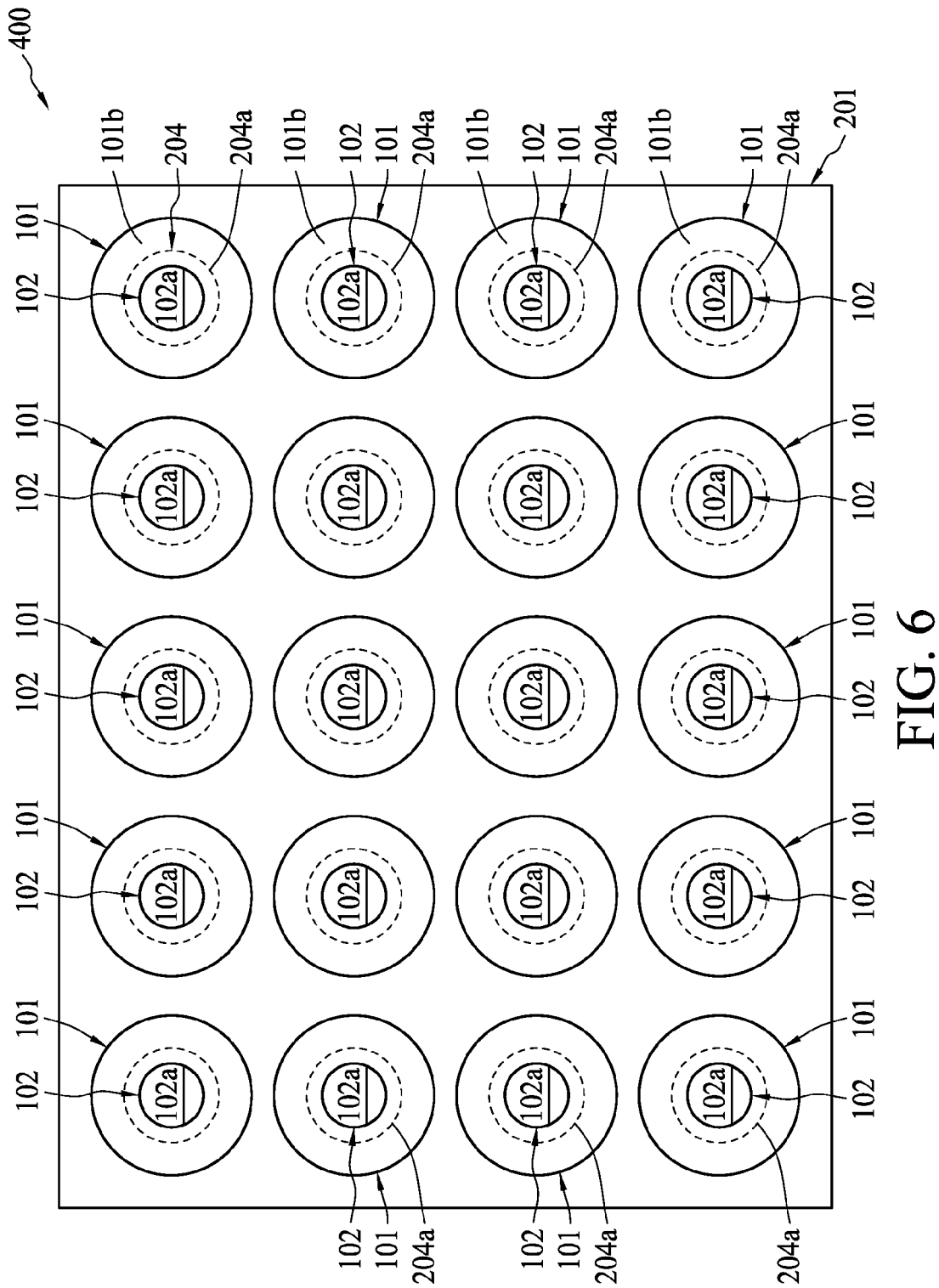
FIG. 6 is a schematic view of a semiconductor structure with several conductive bumps in accordance with some embodiments.

FIG. 6 is a top view of an embodiment of a semiconductor structure 400 in accordance with various embodiments of the present disclosure. The semiconductor structure 400 includes several conductive bumps 101 disposed over a substrate 201. In some embodiments, the conductive bumps 101 are arranged in a matrix or an array. Each of the conductive bumps 101 includes an elongated ferromagnetic member 102. The conductive bumps 101 and the elongated ferromagnetic members 102 have similar configuration as in FIG. 2 or FIG. 3. Each of the elongated ferromagnetic members 102 has a first end 102a exposing from an outer surface 101b of the respective conductive bump 101.

In some embodiments as in FIG. 6, several looping portions 204a of a conductive trace 204 are disposed underneath the conductive bumps 101 and the elongated ferromagnetic members 102. Each of the conductive bumps 101 is disposed above a corresponding looping portion 204a of a conductive trace 204. In some embodiments, each of the elongated ferromagnetic members 102 is disposed within the respective looping portion 204a. The conductive bump 101 including the elongated ferromagnetic member 102 is aligned with the corresponding looping portion 204a, so that the conductive bump 101 is disposed at a predetermined position of the substrate 201 and is oriented at a predetermined orientation. In some embodiments, a center 204b of the looping portion 204a is disposed on a central axis 102c of the elongated ferromagnetic member 102, similar to configuration as in FIG. 4 and FIG. 5.

Figure 6A:
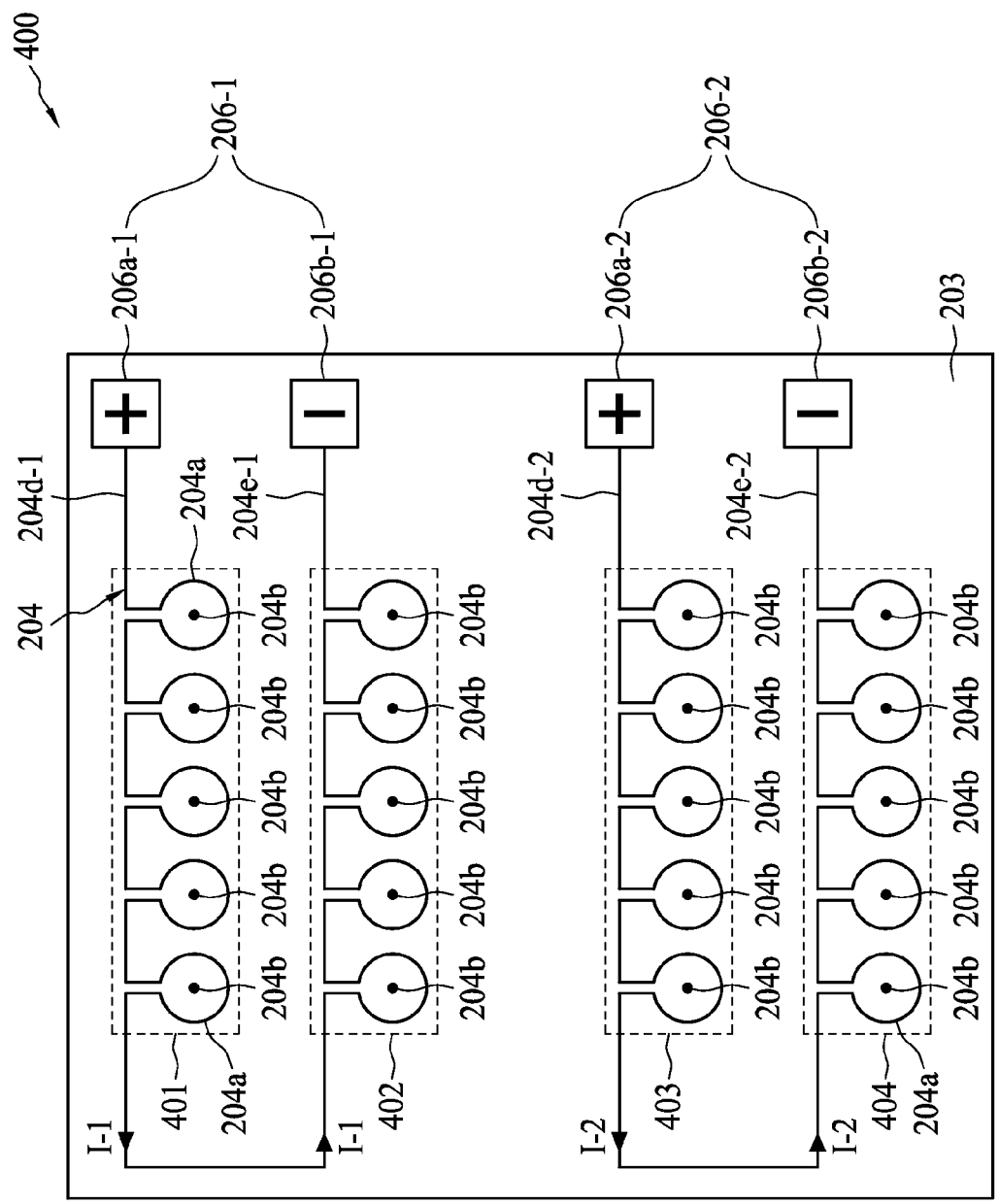
FIG. 6A is a schematic view of a semiconductor structure with several looping portions of a conductive trace connected to two power sources in accordance with some embodiments.

In some embodiments as in FIG. 6A, some of the looping portions 204a of the conductive trace 204 are electrically connected with each other in series and connected to a first power source 206-1, while the rest of the looping portions 204a are electrically connected with each other in series and connected to a second power source 206-2. In some embodiments, a first row 401 and a second row 402 of the looping portions 204a are connected in series and, and two ends (204d-1, 204e-1) of the conductive trace 204 are respectively connected to a positive pole 206a-1 and a negative pole 206b-1 of the first power source 206-1. In some embodiments, a third row 403 and a fourth row 404 of the looping portions 204a are connected in series and, and two ends (204d-2, 204e-2) of the conductive trace 204 are respectively connected to a positive pole 206a-2 and a negative pole 206b-2 of the second power source 206-2.

In some embodiments, a first electric current I-1 from the first power source 206-1 and a second electric current I-2 from the second power source 206-2 passes through the conductive trace 204. An electromagnetic field is generated from each of the looping portions 204a. A conductive bump 101 including an elongated ferromagnetic member 102 is magnetically attracted by the electromagnetic field, such that the conductive bump 101 is disposed at the predetermined position and oriented at the predetermined orientation.

Figure 6B:
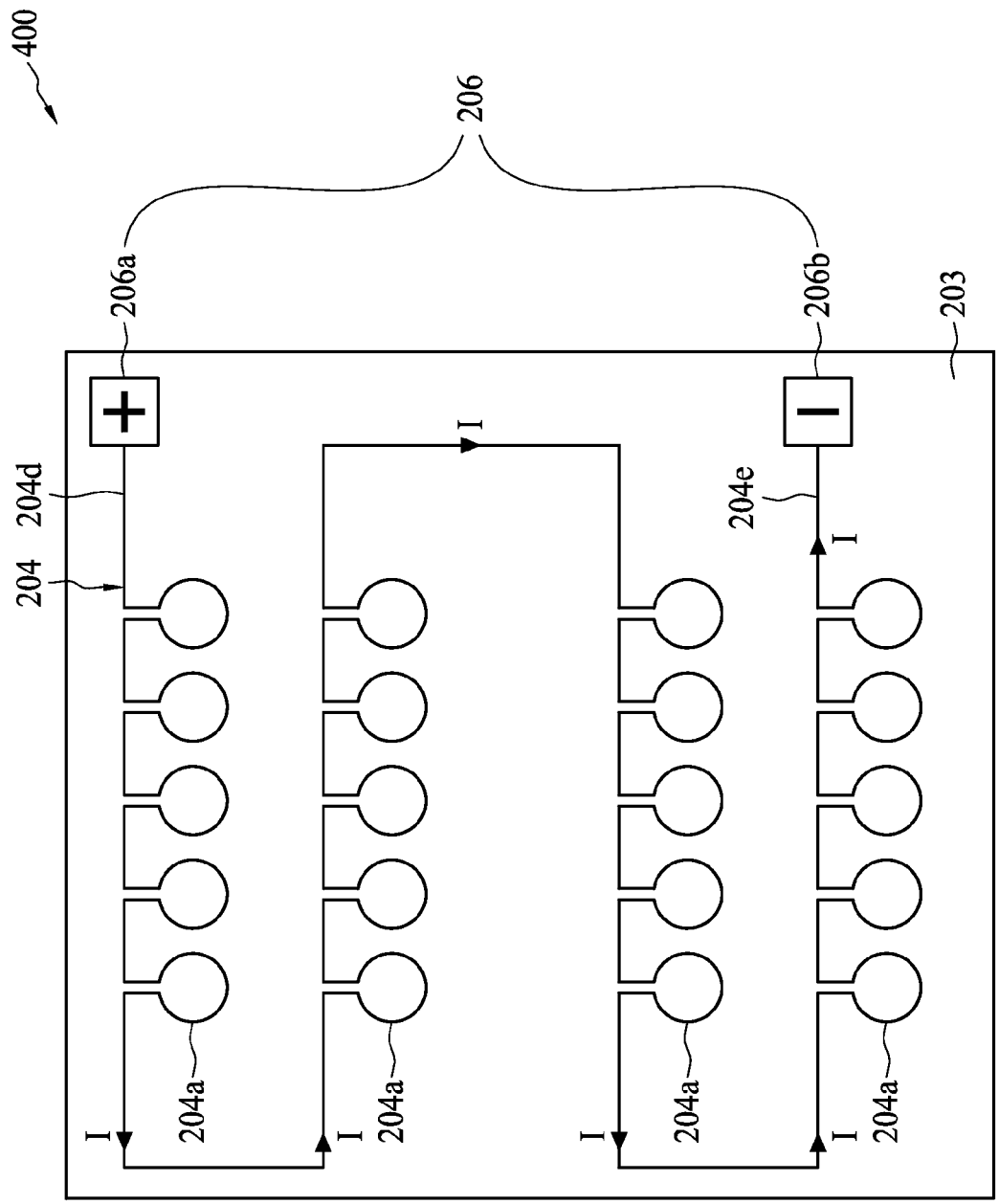
FIG. 6B is a schematic view of a semiconductor structure with several looping portions of a conductive trace in series connected to a power source in accordance with some embodiments.

In some embodiments as in FIG. 6B, all of the looping portions 204a of the conductive trace 204 are electrically connected with each other in series and connected to a power source 206. Two ends (204d, 204e) of the conductive trace 204 are respectively connected to a positive pole 206a and a negative pole 206b of the power source 206.

In some embodiments, an electric current I from the power source 206 passes through the conductive trace 204, so that an electromagnetic field is generated at each of the looping portions 204a to magnetically attract the respective conductive bump 101 including the elongated ferromagnetic member 102 to dispose at the predetermined position and oriented at the predetermined orientation.

FIG. 7 is a diagram of a semiconductor structure 500 in accordance with various embodiments of the present disclosure. The semiconductor structure 500 includes several conductive bumps 101 disposed over a substrate 201. In some embodiments, each of the conductive bumps 101 includes elongated ferromagnetic members 102. In some embodiments, some of the elongated ferromagnetic members 102 have first ends 102a exposing from outer surfaces of the conductive bumps 101 as in FIG. 2 or FIG. 3, while some of the elongated ferromagnetic members 102 are embedded in the conductive bumps 101 as in FIG. 1.

In some embodiments as in FIG. 7, the conductive bumps 101 adjacent to a corner 201b of the substrate 201 have the first ends 102a of the elongated ferromagnetic members 102 exposing from the outer surfaces 101b, and the conductive bumps 101 adjacent to a central area 201c of the substrate 201 have the elongated ferromagnetic members 102 wholly embedded in the conductive bumps 101. In some embodiments, the exposed first ends 102a adjacent to the corner 201b are configured for aligning the semiconductor structure 500 or for subsequent alignment operation.

Figure 8:
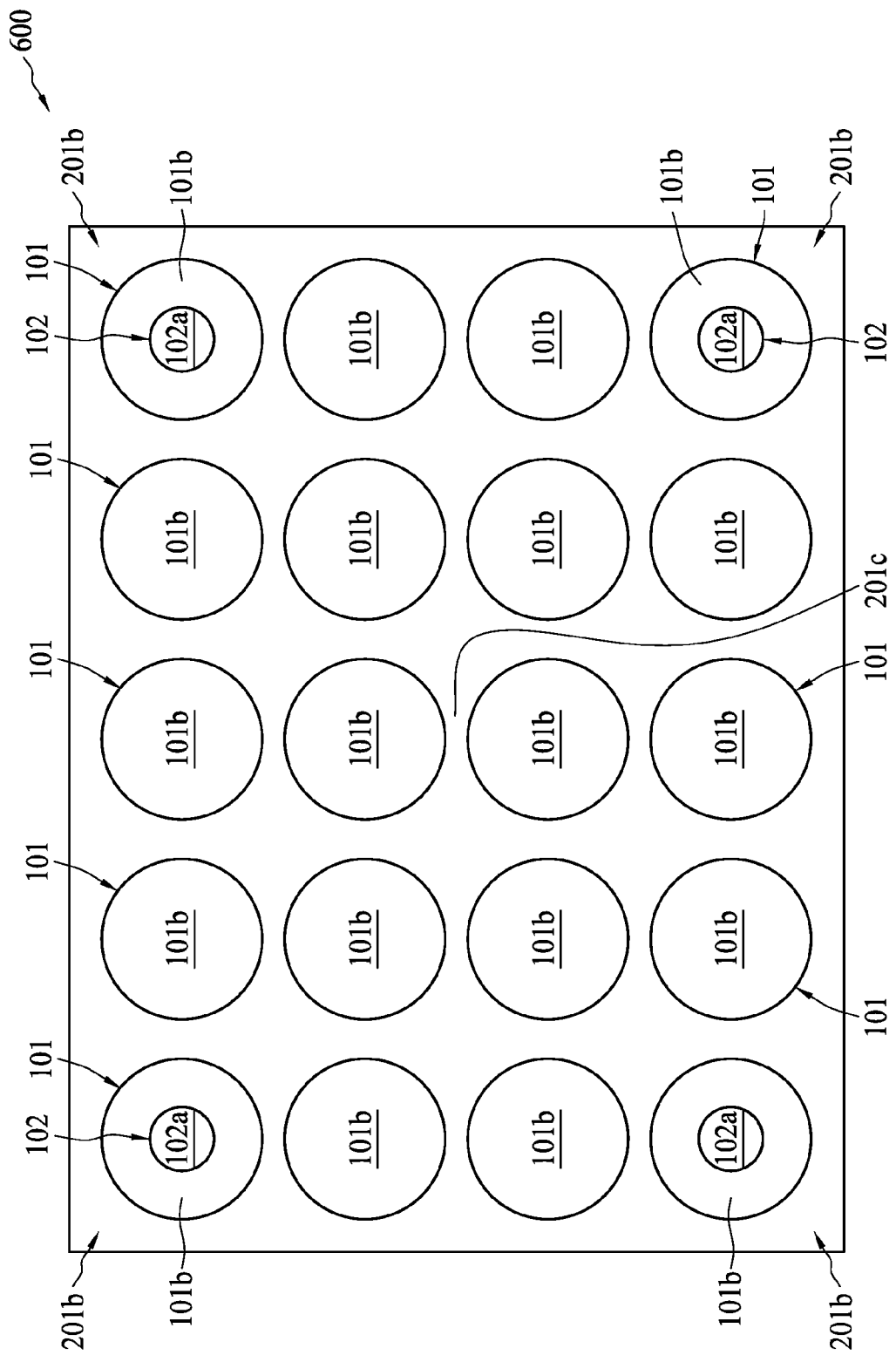
FIG. 8 is a schematic view of a semiconductor structure with several conductive bumps including an exposed end of an elongated ferromagnetic member at a corner of a substrate in accordance with some embodiments.

FIG. 8 is a diagram of a semiconductor structure 600 in accordance with various embodiments of the present disclosure. The semiconductor structure 600 includes several conductive bumps 101 disposed over a substrate 201. In some embodiments, some of the conductive bumps 101 include elongated ferromagnetic members 102 with first ends 102a exposing from outer surfaces of the conductive bumps 101 as in FIG. 2 or FIG. 3, while some of the conductive bumps 101 do not include includes elongated ferromagnetic members.

As in FIG. 8, the conductive bumps 101 at a corner 201b of the substrate 201 have the first ends 102a exposing from the outer surfaces 101b, and the conductive bumps 101 adjacent to a central area 201c of the substrate 201 do not have the elongated ferromagnetic members 102. In some embodiments, the exposed first ends 102a at the corner 201b are configured for aligning the semiconductor structure 500 or for subsequent alignment operation.

In some embodiments, the conductive bumps 101 at the corner 201b have the elongated ferromagnetic members 102 embedded in the conductive bumps 101, while the conductive bumps 101 adjacent to the central area 201c do not have the elongated ferromagnetic members 102. In some embodiments, the embedded elongated ferromagnetic members 102 at the corner 201b are configured for aligning the semiconductor structure 500 or for subsequent alignment operation.

Figure 9:
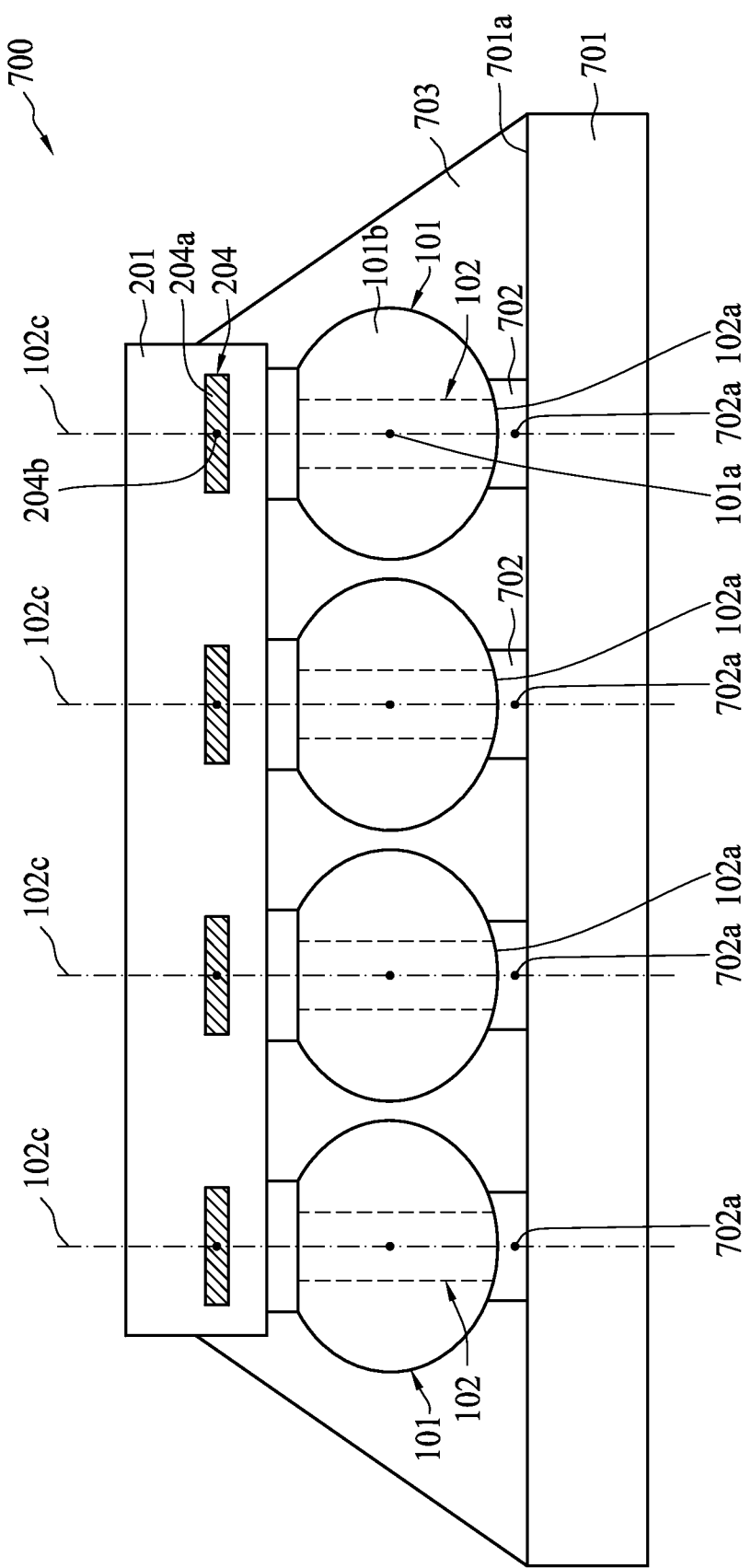
FIG. 9 is a schematic view of a semiconductor structure with two substrates bonded together in accordance with some embodiments.

FIG. 9 is a diagram of a semiconductor structure 700 in accordance with various embodiments of the present disclosure. The semiconductor structure 700 includes a substrate 201, a conductive trace 204, several looping portions 204a, several conductive bumps 101 disposed over the substrate 201 and several elongated ferromagnetic members 102 surrounded by the conductive bumps 101, which have similar configuration as in FIG. 6. Each of the conductive bumps 101 is disposed at a predetermined position of the substrate 201 and oriented at a predetermined orientation in accordance with an electromagnetic field generated by respective looping portion 204a.

In some embodiments as in FIG. 9, the semiconductor structure 700 includes another substrate 701 and several bond pads 702 on surface 701a of the substrate 701. In some embodiments, the substrate 201 is mounted on another substrate 701 by bonding the bond pads 702 with the conductive bumps 101. In some embodiments, the conductive bumps 101 bond with the bond pads 702 by a reflow operation, so that the substrate 201 is electrically connected with the substrate 701 through the conductive bumps 101 and the semiconductor structure 700 becomes a semiconductor package. In some embodiments, an underfill material is disposed between adjacent conductive bumps 101.

In some embodiments, the elongated ferromagnetic members 102 within the conductive bumps 101 are configured for aligning the conductive bumps 101 with the bond pads 702, such that each of the conductive bumps 101 is disposed on a predetermined position of the respective bond pad 702. In some embodiments, the first end 102a of the elongated ferromagnetic member 102 is exposed from the outer surface 101b of the conductive bump 102 and is used for aligning the conductive bump 102 with the bond pad 702. In some embodiments, a center 702a of the bond pad 702 is disposed on a central axis 102c of the elongated ferromagnetic member 102.

In the present disclosure, a method of manufacturing a semiconductor structure is also disclosed. In some embodiments, a semiconductor structure is formed by a method 800. The method 800 includes a number of operations and the description and illustration are not deemed as a limitation as the sequence of the operations.

Figure 10:
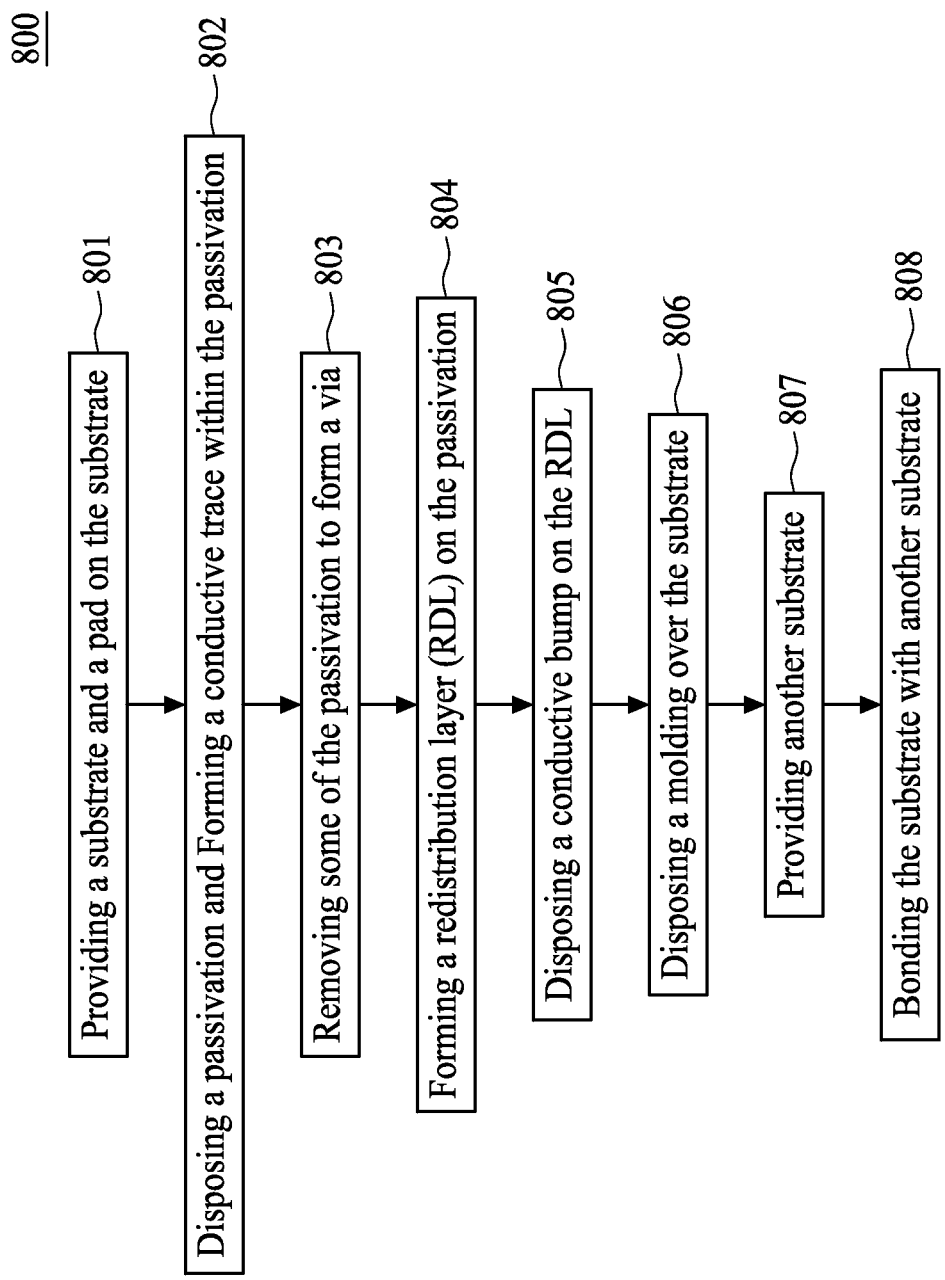
FIG. 10 is a flow diagram of a method of manufacturing a semiconductor structure in accordance with some embodiments.

FIG. 10 is a flowchart of a method 800 of manufacturing a semiconductor structure in accordance with various embodiments of the present disclosure. The method 800 includes a number of operations (801, 802, 803, 804, 805, 806, 807 and 808).

Figure 10A:
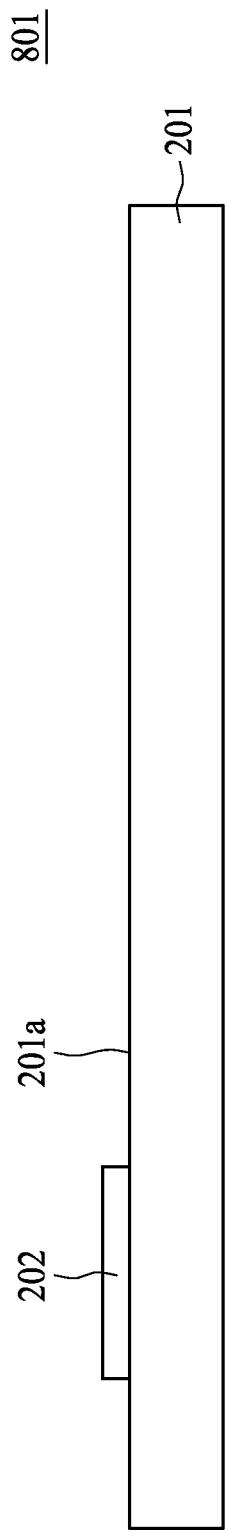
FIG. 10A is a schematic view of a substrate in accordance with some embodiments.

In operation 801, a substrate 201 and a pad 202 are provided as in FIG. 10A. The pad 202 is disposed on the substrate 201. In some embodiments, the substrate 201 includes silicon. In some embodiments, the pad 202 is configured for connecting a circuitry within the substrate 201 with an external circuitry or an external device.

Figure 10B:
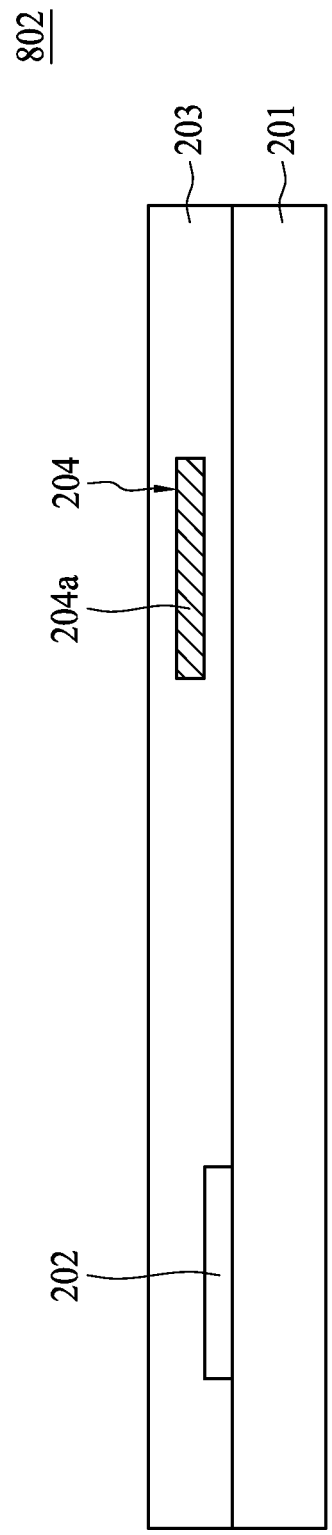
FIG. 10B is a schematic view of a substrate with a conductive trace and a passivation in accordance with some embodiments.

In operation 802, a passivation 203 is disposed over the pad 202 and the substrate 201 as in FIG. 10B. In some embodiments, the passivation 203 surrounds the pad 202. In some embodiments, the passivation 203 is formed on the substrate 201 by chemical vapor deposition (CVD). In some embodiments, a conductive trace 204 including a looping portion 204a is formed within the passivation 203. In some embodiments, the conductive trace 204 is formed by electroplating, sputtering or the like.

Figure 10C:
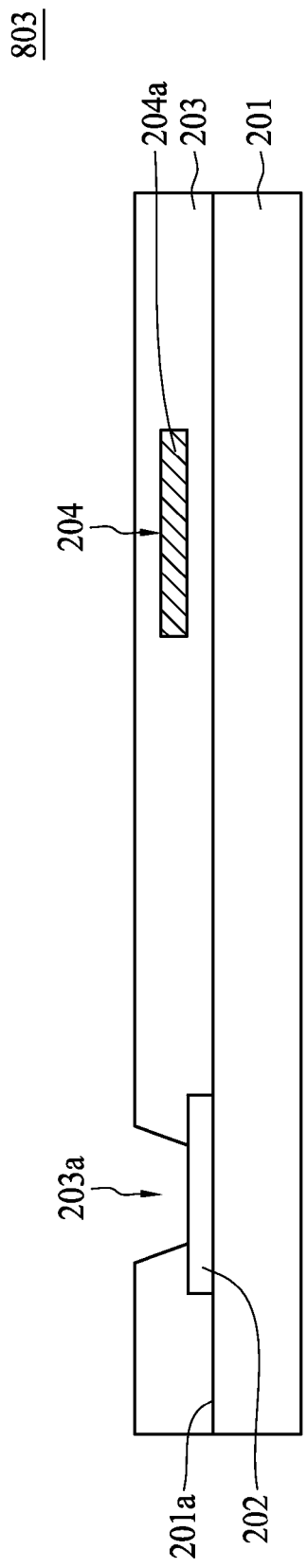
FIG. 10C is a schematic view of a via disposed on a pad in accordance with some embodiments.

In operation 803, some of the passivation 203 are removed to form a via 203a as in FIG. 10C. In some embodiments, some of the passivation 203 above the pad 202 are removed by etching operation. The via 203a is formed above the pad 202.

Figure 10D:
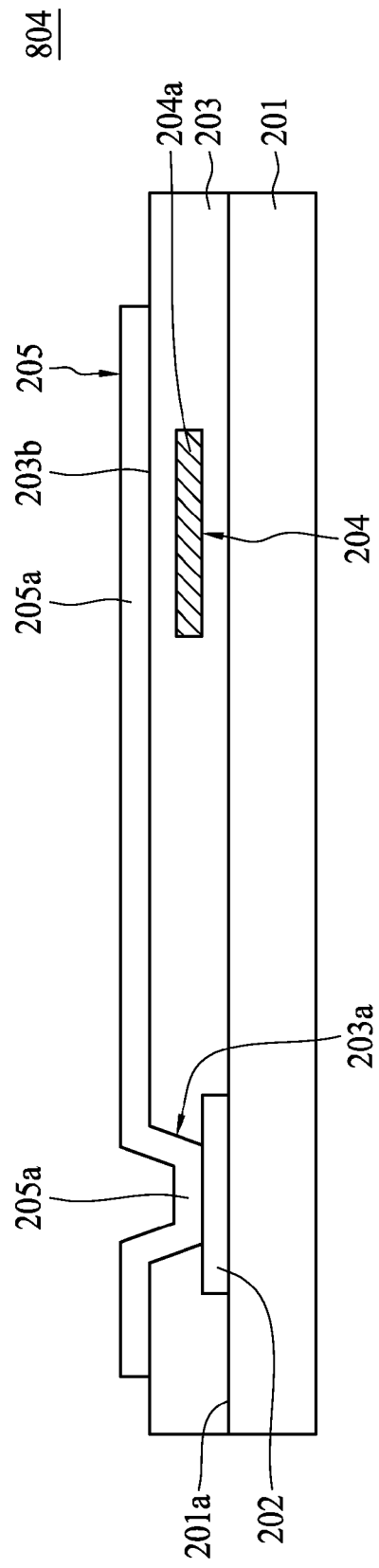
FIG. 10D is a schematic view of a redistribution layer (RDL) on a passivation in accordance with some embodiments.

In operation 804, a RDL 205 is formed on the passivation 203 as in FIG. 10D. In some embodiments, the RDL 205 includes a via portion 205a disposed within the via 203a and a land portion 205b disposed along at top surface 203b of the passivation 203. In some embodiments, the RDL 205 is formed by electroplating or sputtering.

Figure 10E:
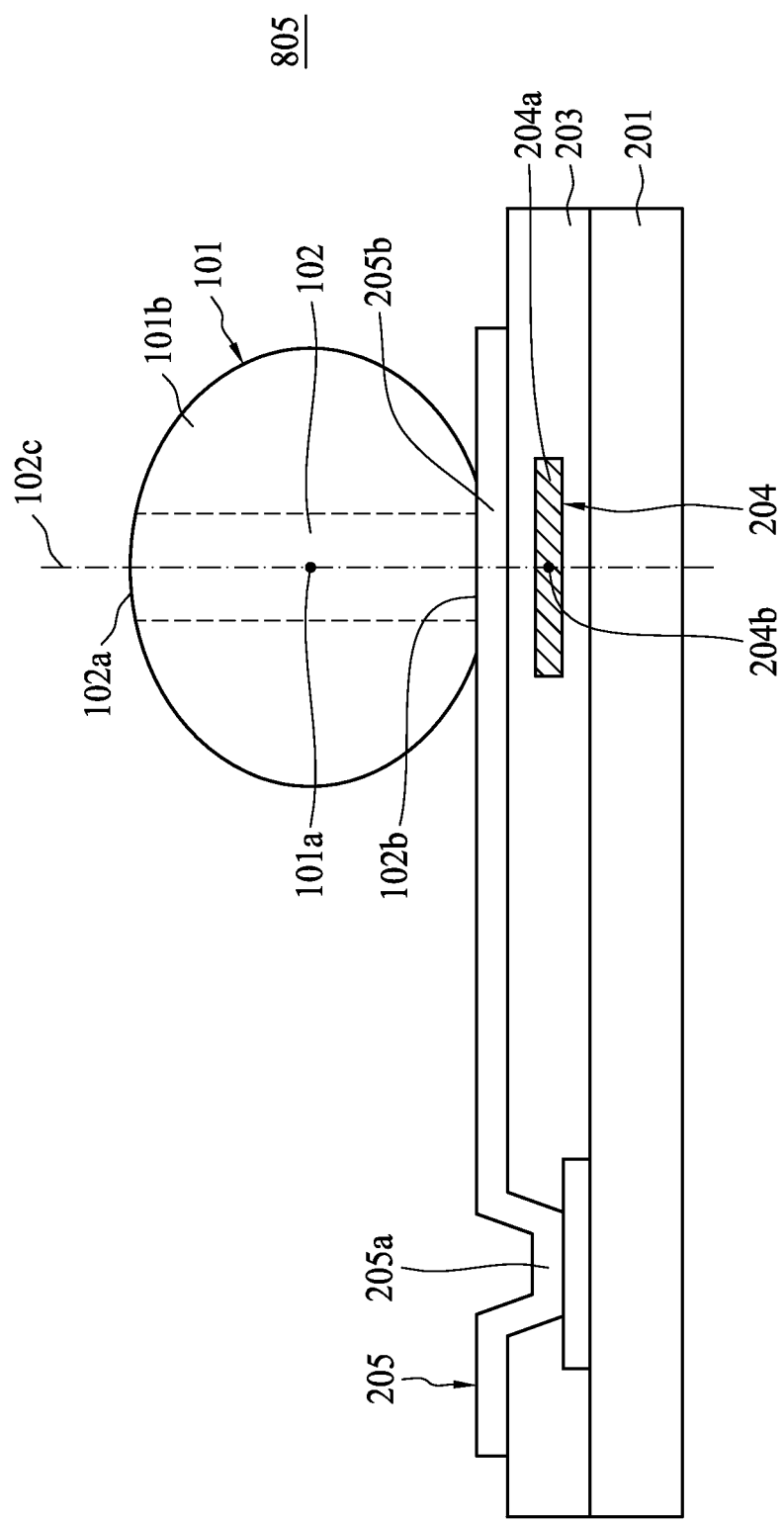
FIG. 10E is a schematic view of a conductive bump disposed on a RDL in accordance with some embodiments.

In operation 805, a conductive bump 101 is disposed on the land portion 205b of the RDL 205 as in FIG. 10E. In some embodiments, the conductive bump 101 including an elongated ferromagnetic member 102 is magnetically attracted to a predetermined position and is oriented at a predetermined orientation by an electromagnetic field generated from the looping portion 204a of the conductive trace 204 as shown in FIG. 4C. In some embodiments, the conductive trace 204 is connected to a power source, an electric current from the power source passes through the looping portion 204a and thus the electromagnetic field is generated within the looping portion 204a. In some embodiments, the electromagnetic field is about 3 mT to about 10 mT.

According to the Biot-Savart Law, the electromagnetic field is more concentrated at the center of the looping portion 204a of the conductive trace 204 than that outside of the conductive trace 204. Therefore, the elongated ferromagnetic member 102 embedded in the conductive bump 101 is attracted to a position close to the center of the looping portion 204a. Accordingly, in some embodiments in accordance with the present disclosure, the orientation of the elongated ferromagnetic member 102 is adjusted in response to the electromagnetic field generated. In some embodiments, the elongated ferromagnetic member 102 is adjusted to an upright position so that the elongated ferromagnetic member 102 is substantially orthogonal to the substrate 201. In some embodiments, the elongated ferromagnetic member 102 is aligned with the electromagnetic field. In some embodiments, the elongated ferromagnetic member 102 is oriented by the electromagnetic field generated from the looping portion 204, such that a central axis 102c of the elongated ferromagnetic member 102 is substantially orthogonal to the substrate 201 and passes through a center 204b of the looping portion 204a. In some embodiments, the elongated ferromagnetic member 102 has a first end 102a disposed distal to the substrate 201 and a second end 102b disposed proximal to the substrate 201. In some embodiments, the second end 102b is disposed on the land portion 205b of the RDL 205.

In some embodiments, the conductive bump 101 is adjusted to be disposed at the predetermined position in response to the electromagnetic field generated from the looping portion 204a. In some embodiments, the conductive bump 101 is disposed at the predetermined position where a center 101a of the conductive bump 101 is aligned with the center 204b of the looping portion 204a. In some embodiments, the center 101a and the center 204b are disposed on the central axis 102c of the elongated ferromagnetic member 102.

Figure 10F:
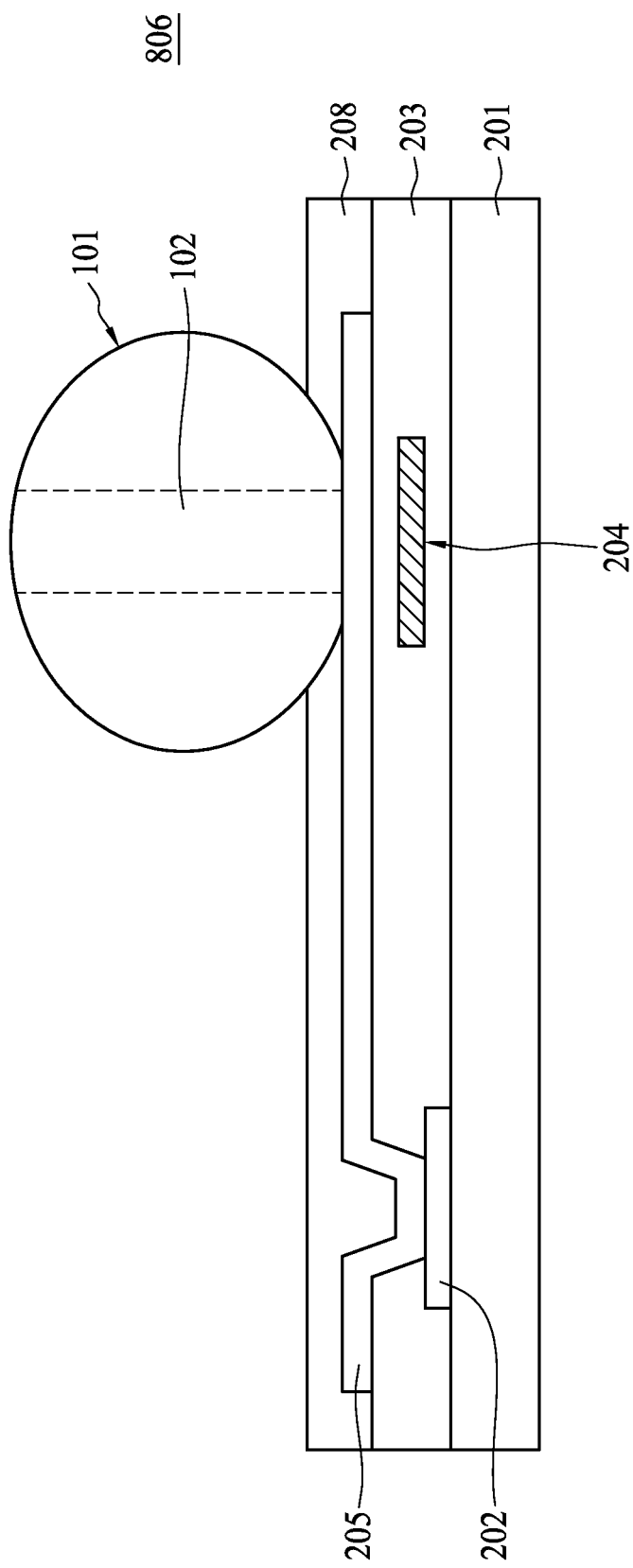
FIG. 10F is a schematic view of a molding surrounding a conductive bump in accordance with some embodiments.

In operation 806, a molding 208 is disposed over the substrate 201 as in FIG. 10F. In some embodiments, the molding 208 is disposed on the RDL 205 and the passivation 203. In some embodiments, the molding 208 surrounds the conductive bump 101. In some embodiments, the molding compound 208 is formed by compression molding operation.

Figure 10G:
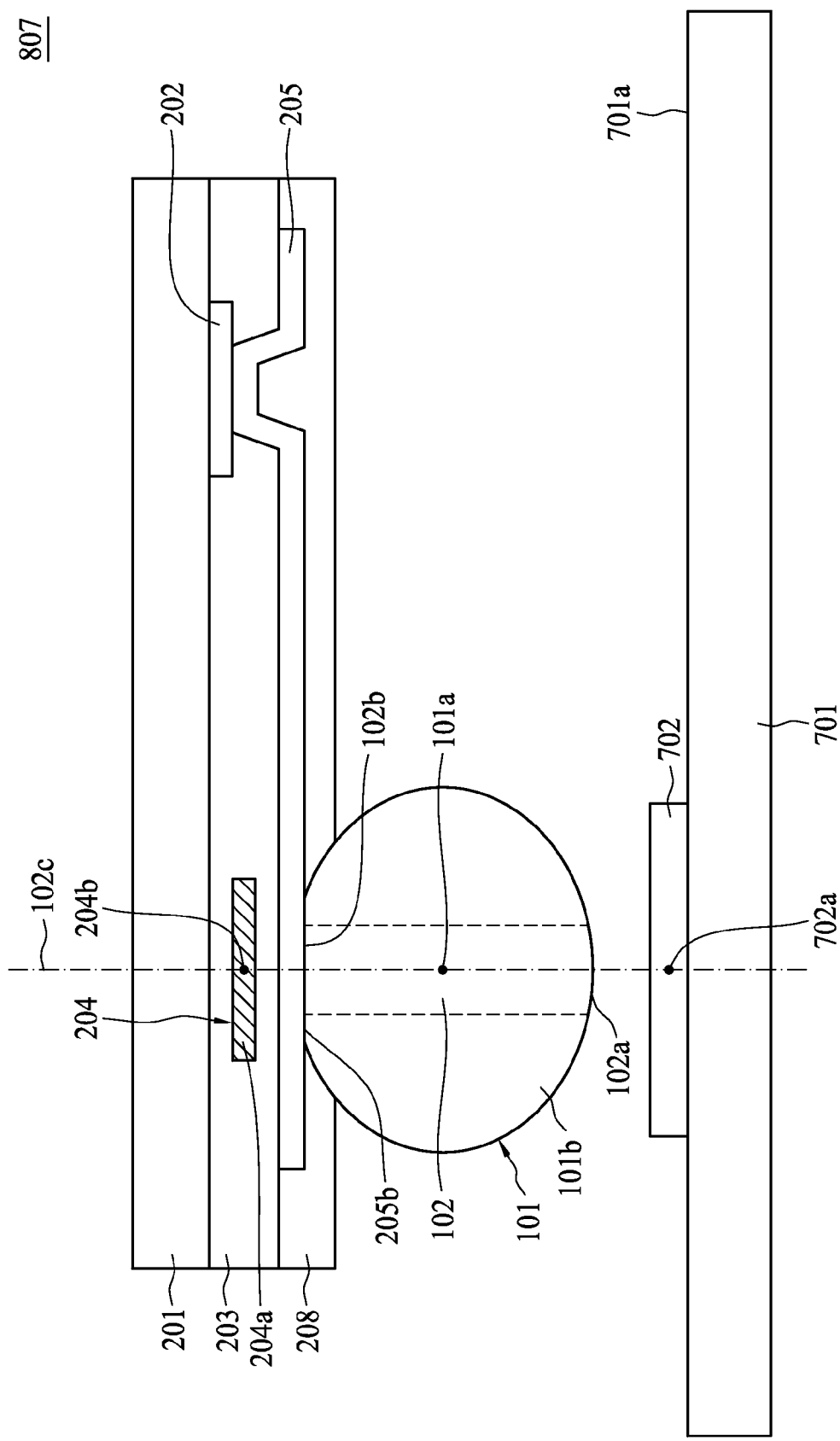
FIG. 10G is a schematic view of a substrate aligned with another substrate in accordance with some embodiments.

In operation 807, another substrate 701 is provided as in FIG. 10G. In some embodiments, the substrate 701 is a printed circuit board including several circuits and components connected with the circuits. In some embodiments, the substrate 701 includes a bond pad 702 disposed on a surface 701a of the substrate 701. In some embodiments, the bond pad 702 of the substrate 701 is configured for receiving the conductive bump 101 disposed over the substrate 201. In some embodiments, the conductive bump 101 is aligned with the bond pad 702 by the elongated ferromagnetic member 102. In some embodiments, the first end 102a of the elongated ferromagnetic member 102 exposed from the outer surface 101b of the conductive bump 101 is configured for aligning the conductive bump 101 with the bond pad 702. In some embodiments, a center 702a of the bond pad 702 is aligned with the center 101a of the conductive bump 101. In some embodiments, the center 702a is disposed on the central axis 102c of the elongated ferromagnetic member 102.

Figure 10H:
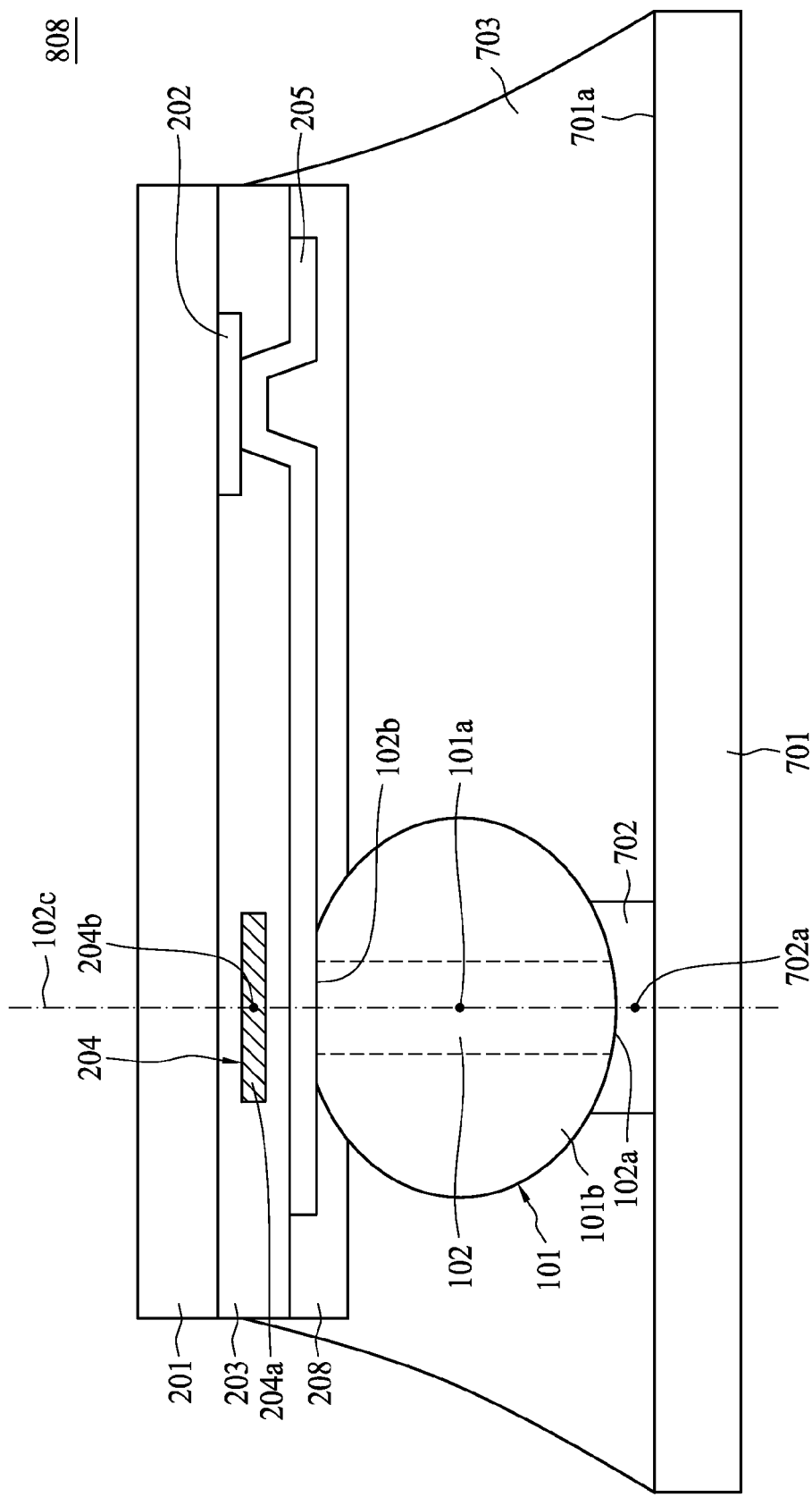
FIG. 10H is a schematic view of a substrate bonded with another substrate in accordance with some embodiments.

In operation 808, the substrate 201 is bonded with another substrate 701 as in FIG. 10H. In some embodiments, the conductive bump 101 is disposed on the bond pad 702 to electrically connect the substrate 201 with another substrate 701, and thus a circuitry within the substrate 201 is electrically connected with a circuitry within the substrate 701. In some embodiments, the conductive bump 101 is bonded with the bond pad 702 by a reflow operation. In some embodiments, an underfill material 703 is disposed around the conductive bump 101.

In the present disclosure, a semiconductor structure includes an elongated ferromagnetic member within a conductive bump to facilitate an alignment of the conductive bump on a predetermined position of a substrate or wafer and an orientation of the conductive bump on the predetermined position. The elongated ferromagnetic member is under an electromagnetic field generated by a conductive trace and is electromagnetically attracted to the predetermined position and orient at a predetermined orientation on the predetermined position. As the conductive bump is aligned and disposed properly and accurately, a reliability of an electrical connection established by the conductive bump between the substrate and another device is increased. Furthermore, the elongated ferromagnetic member exposes its end from the conductive bump and facilitates a "seen" alignment of the semiconductor structure for subsequent operations. In addition, the elongated ferromagnetic member would prevent a development of cracks within the bonding between the substrate and another device.

In some embodiments, a semiconductor structure includes a conductive bump for disposing over a substrate and an elongated ferromagnetic member surrounded by the conductive bump, including a first end and a second end, and extended from the first end to the second end, the elongated ferromagnetic member is disposed substantially orthogonal to the substrate to dispose the conductive bump at a predetermined orientation and at a predetermined position over the substrate.

In some embodiments, the elongated ferromagnetic member has a ratio of a width to a length of about 1:2 to about 1:20. In some embodiments, the predetermined orientation is a center of the conductive bump disposed on a central axis of the elongated ferromagnetic member. In some embodiments, the first end is exposed from an outer surface of the conductive bump. In some embodiments, the first end is covered by an outer surface of the conductive bump. In some embodiments, the second end is disposed on a bump pad of the substrate. In some embodiments, wherein the elongated ferromagnetic member is in a cylindrical shape with a cross section in a circular, quadrilateral, polygonal or cross shape.

In some embodiments, a semiconductor structure includes a substrate, a conductive trace embedded in the substrate and configured for connecting to a power source, and a conductive bump disposed over the substrate and including an elongated ferromagnetic member encapsulated by the conductive bump, the elongated ferromagnetic member includes a first end distal from the conductive trace, a second end proximal to the conductive trace, and a cross section substantially parallel to the conductive trace.

In some embodiments, the conductive trace includes a looping portion for generating an electromagnetic field and disposing the conductive bump to a predetermined position over the substrate. In some embodiments, a central axis of the elongated ferromagnetic member passes through a center of a looping portion of the conductive trace. In some embodiments, a central axis of the elongated ferromagnetic member is substantially orthogonal to the conductive trace. In some embodiments, the elongated ferromagnetic member is disposed at a corner of the substrate. In some embodiments, the conductive trace includes a looping portion having a diameter of about 100 um to about 300 um. In some embodiments, the semiconductor structure further comprising a molding surrounding the conductive bump.

In some embodiments, a method of manufacturing a semiconductor structure includes providing a substrate, forming a conductive trace within the substrate, applying an electric current passing through the conductive trace to generate an electromagnetic field and disposing a conductive bump including an elongated ferromagnetic member in a predetermined orientation and at a predetermined position over the substrate in response to the electromagnetic field generated by the conductive trace.

In some embodiments, the disposing the conductive bump includes orienting the elongated ferromagnetic member standing substantially orthogonal to the substrate in response to the electromagnetic field. In some embodiments, the electromagnetic field is about 3 mT to about 10 mT. In some embodiments, the forming the conductive trace includes forming a looping portion and passing the electric current through the looping portion to generate the electromagnetic field and align a center of the conductive bump with a center of the looping portion. In some embodiments, the disposing the conductive bump includes magnetically attracting the conductive bump to the predetermined position where the elongated ferromagnetic member is aligned with the electromagnetic field.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a conductive bump for disposing over a substrate; and
   an elongated ferromagnetic member surrounded by the conductive bump, including a first end and a second end, and extended from the first end to the second end,
   wherein the elongated ferromagnetic member is disposed substantially orthogonal to the substrate, and a center of the conductive bump is disposed on a central axis of the elongated ferromagnetic member.

2. The semiconductor structure of claim 1, wherein the elongated ferromagnetic member has a ratio of a width to a length of about 1:2 to about 1:20.

3. The semiconductor structure of claim 1, wherein the central axis of the elongated ferromagnetic member passes through the first end, the second end and the center of the conductive bump.

4. The semiconductor structure of claim 1, wherein the first end is exposed from an outer surface of the conductive bump.

5. The semiconductor structure of claim 1, wherein the first end is covered by an outer surface of the conductive bump.

6. The semiconductor structure of claim 1, wherein the second end is disposed on a bump pad of the substrate.

7. The semiconductor structure of claim 1, wherein the elongated ferromagnetic member is in a cylindrical shape with a cross section in a circular, quadrilateral, polygonal or cross shape.

8. A semiconductor structure, comprising:
   a substrate;
   a conductive trace embedded in the substrate and configured for connecting to a power source; and
   a conductive bump disposed over the substrate and including an elongated ferromagnetic member encapsulated by the conductive bump,
   wherein the elongated ferromagnetic member includes a first end distal from the conductive trace and a second end proximal to the conductive trace, the conductive trace includes a looping portion for generating an electromagnetic field and disposing the conductive bump to a predetermined position over the substrate.

9. The semiconductor structure of claim 8, wherein a center of the looping portion is aligned with a center of the conductive bump.

10. The semiconductor structure of claim 8, wherein a central axis of the elongated ferromagnetic member passes through a center of a looping portion of the conductive trace.

11. The semiconductor structure of claim 8, wherein a central axis of the elongated ferromagnetic member is substantially orthogonal to the conductive trace.

12. The semiconductor structure of claim 8, wherein the elongated ferromagnetic member is disposed at a corner of the substrate.

13. The semiconductor structure of claim 8, wherein the conductive trace includes a looping portion having a diameter of about 100 um to about 300 um.

14. The semiconductor structure of claim 8, further comprising a molding surrounding the conductive bump.

15. A method of manufacturing a semiconductor structure, comprising:
   providing a substrate;
   forming a conductive trace within the substrate;
   applying an electric current passing through the conductive trace to generate an electromagnetic field;
   disposing a conductive bump including an elongated ferromagnetic member in a predetermined orientation and at a predetermined position over the substrate in response to the electromagnetic field generated by the conductive trace; and wherein the forming the conductive trace includes forming a looping portion and passing the electric current through the looping portion to generate the electromagnetic field and align a center of the conductive bump with a center of the looping portion.

16. The method of claim 15, wherein the disposing the conductive bump includes orienting the elongated ferromagnetic member standing substantially orthogonal to the substrate in response to the electromagnetic field.

17. The semiconductor structure of claim 15, wherein the electromagnetic field is about 3 mT to about 10 mT.

18. The semiconductor structure of claim 15, wherein the disposing the conductive bump includes magnetically attracting the conductive bump to the predetermined position where the elongated ferromagnetic member is aligned with the electromagnetic field.

19. The semiconductor structure of claim 15, further comprising aligning the semiconductor structure by a surface disposed at an end of the elongated ferromagnetic member and exposed from the conductive bump.

* * * * *